(12) United States Patent
Ono et al.

(10) Patent No.: US 6,642,575 B1
(45) Date of Patent: Nov. 4, 2003

(54) MOS TRANSISTOR WITH VERTICAL COLUMNAR STRUCTURE

(75) Inventors: Mizuki Ono, Kanagawa-ken (JP); Akira Toriumi, Kanagawa-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/453,550

(22) Filed: Dec. 3, 1999

(30) Foreign Application Priority Data

Dec. 4, 1998 (JP) .......................................... 10-345632

(51) Int. Cl.⁷ ........................ H01L 29/94; H01L 31/113
(52) U.S. Cl. ........................................ 257/328; 257/302
(58) Field of Search ................................ 257/302, 314, 257/315, 316, 328, 329, 330, 331, 332, 334

(56) References Cited

U.S. PATENT DOCUMENTS

| | | | | |
|---|---|---|---|---|
| 5,398,200 A | * | 3/1995 | Mazure et al. ............... | 365/174 |
| 5,416,350 A | * | 5/1995 | Watanabe .................... | 257/330 |
| 5,477,068 A | * | 12/1995 | Ozawa ......................... | 257/214 |
| 5,994,735 A | * | 11/1999 | Maeda et al. ................ | 257/329 |
| 6,172,391 B1 | * | 1/2001 | Goebel et al. ............... | 257/305 |
| 6,255,684 B1 | * | 7/2001 | Roesner et al. ............. | 257/302 |
| 6,281,557 B1 | * | 8/2001 | Trueby et al. ............... | 257/390 |

FOREIGN PATENT DOCUMENTS

| | | |
|---|---|---|
| JP | 59-35463 | 2/1984 |
| JP | 60-189962 | 9/1985 |
| JP | 4-207069 | 7/1992 |
| JP | 6-53513 | 2/1994 |
| JP | 6-120354 | 4/1994 |
| JP | 11-8386 | 1/1999 |

* cited by examiner

*Primary Examiner*—Tom Thomas
*Assistant Examiner*—Douglas W. Owens
(74) *Attorney, Agent, or Firm*—Finnegan, Henderson, Farabow, Garrett & Dunner, L.L.P.

(57) ABSTRACT

A field-effect transistor has a vertical columnar structure to restrain a short channel effect without impairing the operating speed of an element. In a semiconductor device having a field-effect transistor with a vertical columnar structure, an n-type diffusion layer region is formed in a surface layer of a p-type silicon substrate. A columnar structure portion is formed in which an n-type silicon layer, a buried insulation film and an n-type silicon layer are stacked over the n-type diffusion layer region and the buried insulation film is set back inward from both silicon layers. A silicon layer is formed over the side surface of the columnar structure portion, and a gate electrode is formed over the surface of the silicon layer with a gate insulation film that is interposed therebetween.

11 Claims, 18 Drawing Sheets

MOS TRANSISTOR WITH VERTICAL COLUMNAR STRUCTURE

BACKGROUND OF THE INVENTION

1. Field of the Invention

The present invention relates to a semiconductor device having field-effect transistors having a vertical structure, and a method of manufacturing such a semiconductor device.

2. Discussion of the Background

A field-effect transistor having a vertical columnar structure such as that shown in FIG. 12 has heretofore been proposed for effective utilization of the area of a chip.

FIG. 12 is a cross-sectional view of a prior art field effect transistor with a vertical columnar structure. An isolation region 81 is formed over a surface portion of a p-type semiconductor substrate 80 so as to surround an active area, and a columnar silicon region 82 is formed in a portion of the active area. A gate electrode 84 made of polycrystalline silicon is formed over the side surface of the columnar silicon region 82 with a gate insulating film 83 made of silicon oxide being interposed therebetween. Arsenic (As) ions are implanted into the top surface of the columnar silicon region 82 and part of the surface of the semiconductor substrate 80 to form source and drain regions 86. An interlayer insulating film 88 is deposited over the entire surface of the substrate 80, and an interconnecting layer 89 made of aluminum is formed in each opening formed in the interlayer insulating film 88.

However, this type of field-effect transistor having such a vertical columnar structure has several problems. Specifically, if the distance between the source and the drain of the transistor is less than a certain limit, control by the gate electrode does not work in the central portion of the columnar structure and punch-through occurs. This short channel effect is problematic. Accordingly, the field-effect transistor having such a vertical columnar structure has been difficult to scale.

If the concentration of an impurity in a channel formation region is high, the short channel effect is restrained, and the mobility of carriers is lowered by scattering due to the impurity. For this reason, it has been difficult to make such an element operate at high speeds. Moreover, an increase in the concentration of the impurity in the channel formation region causes loss of a region to which electric charge produced by hot carriers in the element can escape, and this electric charge stays in the channel region.

Incidentally, a structure, such as a silicon-on-insulator (SOI) structure, which has an impurity region near the center of a columnar structure is available as a method of restraining punch-through. However, this structure causes the area of a cross section of the source and drain, which is cut at right angles to the channel regions, to be small so that a current path is narrow and parasitic resistance increases.

FIG. 13 is a cross-sectional view of a conventional semiconductor integrated circuit. The integrated circuit includes a p-type silicon substrate 90, an isolation region 91, a p-well region 92, an n-well region 93, gate electrodes 94, source or drain regions 95, first interlayer insulating films 96, second interlayer insulating films 97, first-layer interconnecting lines 98, and second-layer interconnecting lines 99.

In this type of semiconductor integrated circuit, field-effect transistors are formed in only one plane. Consequently, the scale of integration is limited, so that the total length of interconnecting lines for interconnecting elements is long. The resultant interconnecting delay impairs the high-speed operation of the semiconductor integrated circuit.

SUMMARY OF THE INVENTION

The present invention has been made in view of the above-described problems, and an object of the present invention is to provide a semiconductor device capable of effectively restraining a short channel effect in a field-effect transistor having a vertical columnar structure without impairing the operating speed of the device.

Another object of the present invention is to provide a semiconductor device that has increasable scalability of integration per semiconductor integrated circuit by using field-effect transistors having vertical columnar structure and which can restrain an interconnecting delay and operate at high speeds.

One aspect of the present invention provides a semiconductor device which comprises a field-effect transistor having a vertical columnar structure which includes a semiconductor layer formed over part of a semiconductor substrate, a gate electrode formed over a side surface of the semiconductor layer; and an insulation film for making a channel of the field-effect transistor substantially shallow in depth. The insulation film is formed in at least part of a region in which the channel of the field-effect transistor is formed. In this semiconductor device, the semiconductor layer may have a columnar structure and the gate electrode may be formed to surround the side surface of the semiconductor layer.

Another aspect of the present invention provides a semiconductor device having a field-effect transistor of vertical columnar structure comprising a columnar structure portion which includes a first semiconductor layer, a buried insulation film and a second semiconductor layer, all of which are stacked over a semiconductor substrate. The buried insulation film is set back inward from the first and second semiconductor layers. A third semiconductor layer is formed in at least a set-back portion of the buried insulation film at a side surface of the columnar structure portion. A gate electrode is formed over a surface of the third semiconductor layer with a gate insulating film being interposed therebetween.

The semiconductor substrate may be a first conductivity type, and the first and second semiconductor layers may be a second conductivity type. The second semiconductor layer may be formed over the entire side surface of the columnar structure portion, together with the set-back portion of the buried insulation film. The gate insulating film and the gate electrode may be formed over the entire side surface of the columnar structure portion and over part of the surface of the substrate. The values of source voltage, drain voltage and gate voltage may be selected to deplete a portion of a semiconductor region between a source region and a drain region other than an inversion layer region which is formed at an interface with a gate insulating film. The present invention may also provide that when a semiconductor which forms source and drain regions is cut in a plane perpendicular to the direction of a channel, the area of a cross section obtained is greater than the area of a cross section obtained when a semiconductor which forms a channel region is cut in a plane perpendicular to the direction of the channel. The channel region may be a single-crystal semiconductor.

Another aspect of the present invention provides a semiconductor device having a field-effect transistor of vertical columnar structure comprising a columnar structure portion including a buried insulation film and a first semiconductor layer which are stacked over a semiconductor substrate. The buried insulation film is formed set back inward from the first semiconductor layer; a second semiconductor layer is formed in at least a set-back portion of the buried insulation film of the columnar structure portion; and a gate electrode is formed over a surface of the second semiconductor layer with a gate insulating film being interposed therebetween.

Another aspect of the present invention provides a semiconductor device comprising a first element formation layer including a plurality of field-effect transistors of horizontal structure formed over a semiconductor substrate; a second element formation layer including a plurality of field-effect transistors of horizontal structure formed on a plane different from the first element formation layer; and a field-effect transistor of vertical columnar structure provided between the first element formation layer and the second element formation layer and connected to at least one transistor of the first element formation layer and to at least one transistor of the second element formation layer. The field-effect transistor having a vertical columnar structure includes a semiconductor layer formed on the semiconductor substrate in a columnar state, a gate electrode formed over a side surface of the semiconductor layer, and a buried insulation film for making an effective depth of a channel shallow. The buried insulation film is formed inside a region in which the channel is formed.

Another aspect of the present invention provides a method of manufacturing a semiconductor device having a field-effect transistor of vertical columnar structure, which method comprises the steps of: stacking a first semiconductor layer, a buried insulation film and a second semiconductor layer over a semiconductor substrate; forming a columnar structure portion by selectively etching the first and second semiconductor layers and the buried insulation film; forming a third semiconductor layer over a side surface of the columnar structure portion; and forming a gate electrode over a surface of the third semiconductor layer with a gate insulating film being interposed therebetween.

Another aspect of the present invention provides a method of manufacturing a semiconductor device having a field-effect transistor of vertical columnar structure, which method comprises the steps of: forming a masking insulation film over a semiconductor substrate; forming an opening in the masking insulation film; forming a first semiconductor layer at a bottom portion of the opening of the masking insulation film; forming a side wall insulation film over a side surface of the opening of the masking insulation film; forming a buried insulation film over an exposed portion of the first semiconductor layer; removing the side wall insulation film; forming a third semiconductor layer over the exposed portion of the first semiconductor layer; forming a second semiconductor layer over the third semiconductor layer and the buried insulation film; removing the masking insulation film; and forming a gate electrode over a surface of the third semiconductor layer with a gate electrode being interposed therebetween.

According to the present invention, punch-through can be restrained without the need to increase the impurity concentration in the semiconductor of a channel region. Moreover, no increase in the parasitic resistance of the element is incurred. Accordingly, a short channel effect may be restrained without impairing the operating speed of the element, and a high-performance semiconductor device which operates at high speeds is realized.

In addition, in accordance with the present invention, a field-effect transistor having a vertical columnar structure may be formed in a region which couples element formation layers to each other. Accordingly, an extremely large scale of integration compared to conventional semiconductor integrated circuits may be realized. Accordingly, the total length of interconnecting lines may be reduced to restrain a decrease in operating speed due to interconnecting delay, whereby a high-performance semiconductor integrated circuit which operates at high speeds can be realized.

The above and other objects, features and advantages of the present invention will be apparent from the following description of preferred embodiments of the invention, taken in conjunction with the accompanying drawings.

DESCRIPTION OF THE PREFERRED EMBODIMENTS

Preferred embodiments of the present invention are described below in detail with reference to the accompanying drawings.

Figure 1:
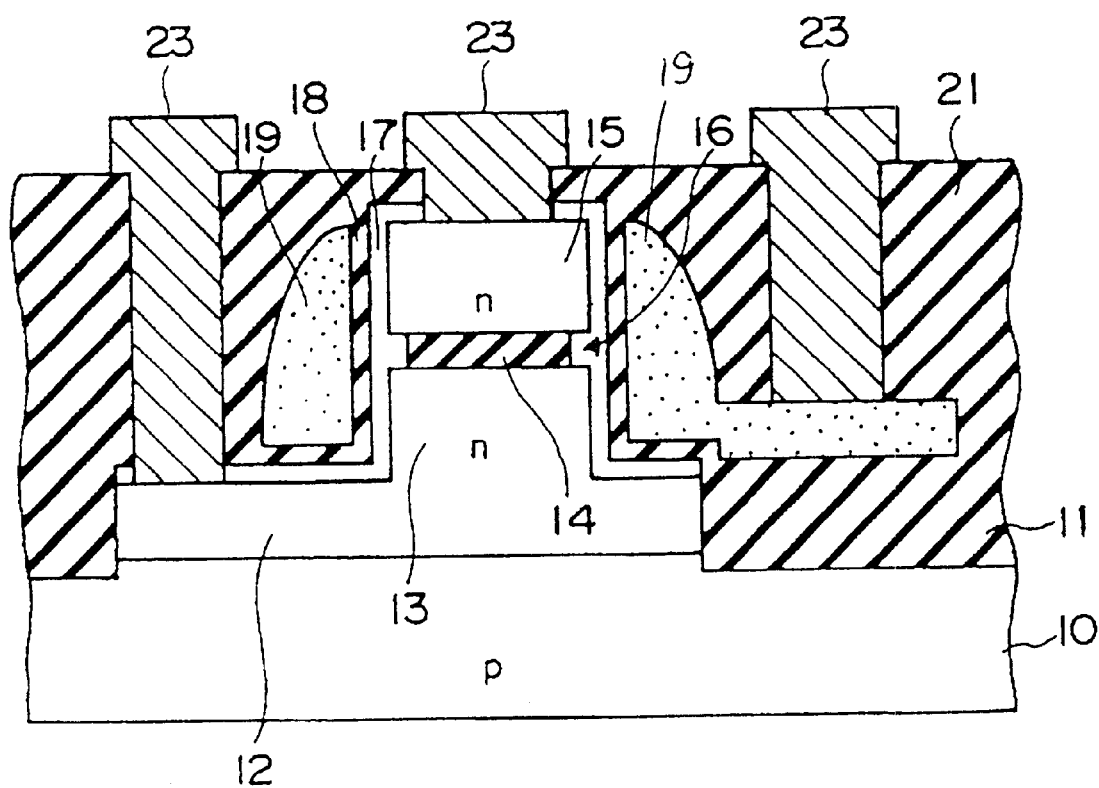
FIG. 1 is a cross-sectional view of an element including a field-effect transistor having a vertical columnar structure according to a first embodiment of the present invention.

FIG. 1 is a cross-sectional view of an element including a field-effect transistor having a vertical columnar structure according to a first embodiment of the present invention.

An isolation region 11 is formed over the surface of a p-type silicon substrate 10 to surround an active area, and an n-type diffusion layer region 12 is formed in the active area. The isolation region 11 may be, for example, a silicon oxide film. A first semiconductor layer 13 is formed over a portion of the n-type diffusion layer region 12. The first semiconductor layer 13 may be an n-type silicon layer and is referred to hereinafter as "n-type silicon layer 13." The n-type silicon layer 13 and the n-type diffusion layer region 12 constitute either one of source and drain regions. A buried insulation film 14 is formed over the n-type silicon layer 13. The buried insulation film 14 may be, for example, a silicon oxide film. A second semiconductor layer 15, which constitutes the other of the source and drain regions, is formed over the buried insulation film 14. The second semiconductor layer 15 may be, for example, an n-type silicon layer, and is referred to hereinafter as "n-type silicon layer 15." The n-type silicon layer 13, the buried insulation film 14 and the n-type silicon layer 15 constitute a columnar structure portion 16, and the buried insulation film 14 is recessed or set back inward from the silicon layers 13 and 15.

A third semiconductor layer 17 is formed over the side surface of the columnar structure portion 16 and the top surface of the n-type diffusion layer region 12. The third semiconductor layer 17 may be, for example, a silicon layer, and is referred to hereinafter as "silicon layer 17." A gate electrode 19 is formed over the silicon layer 17 with a gate insulating film 18 interposed therebetween. The gate insulating film 18 may be, for example, a silicon oxide film, and is referred to hereinafter as "silicon oxide film 18." An interlayer insulating film 21 is formed over these layers 17, 18 and 19, and an interconnecting layer 23 is formed in each contact hole formed in the interlayer insulating film 21 and over the interlayer insulating film 21. Although not shown in FIG. 1, the top surface of an element board to be finally obtained may be covered with a passivation film for protecting the element board.

A method of manufacturing the field-effect transistor having this vertical columnar structure is described below with reference to FIGS. 2a to 2g.

FIGS. 2a–2g are cross-sectional views of a process of manufacturing the field effect transistor according to the first embodiment of the present invention.

Figure 2:
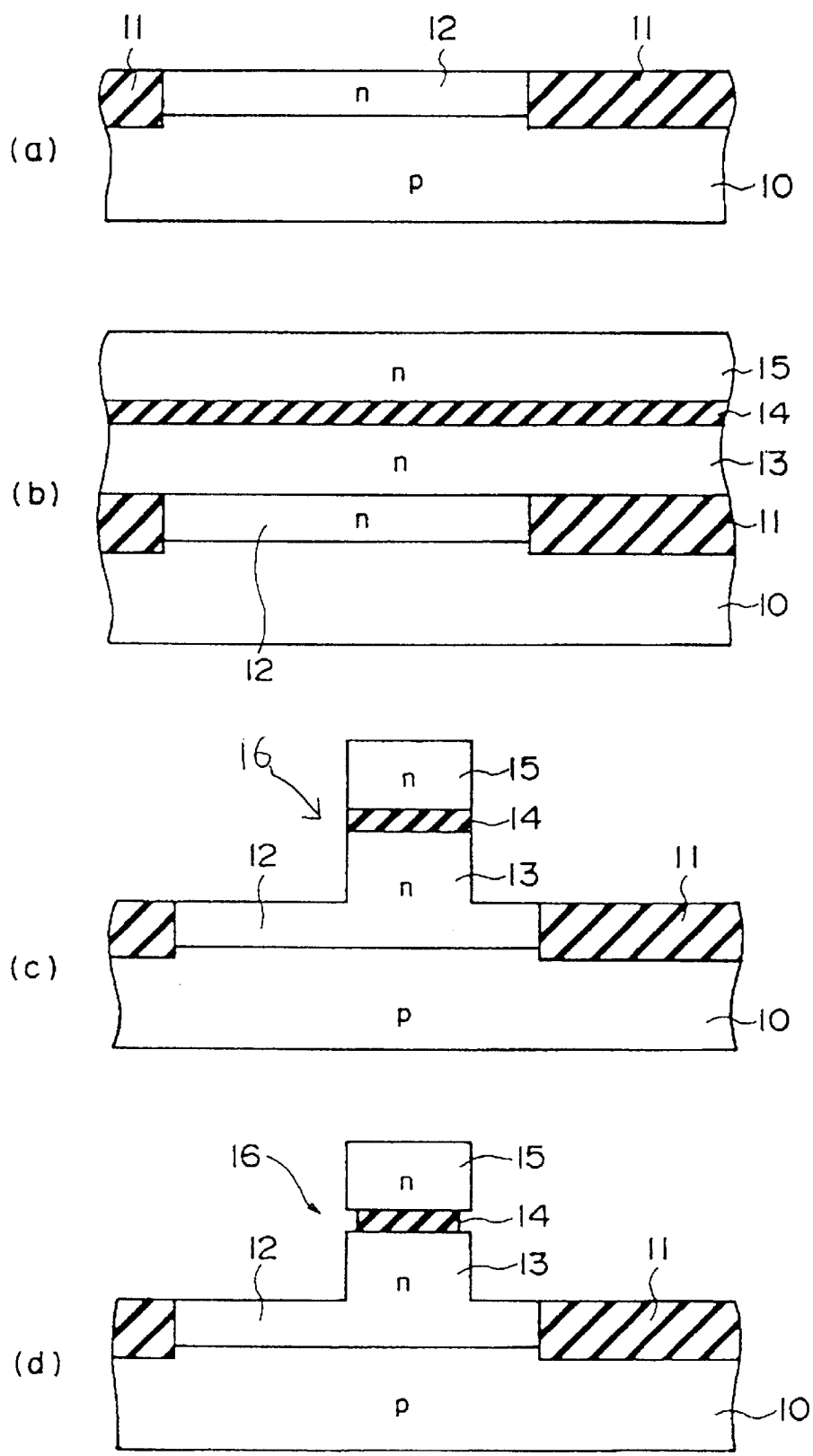
FIGS. 2a to 2g are cross-sectional views of the process of manufacturing the field-effect transistor according to the first embodiment of the present invention.
Figure 2:
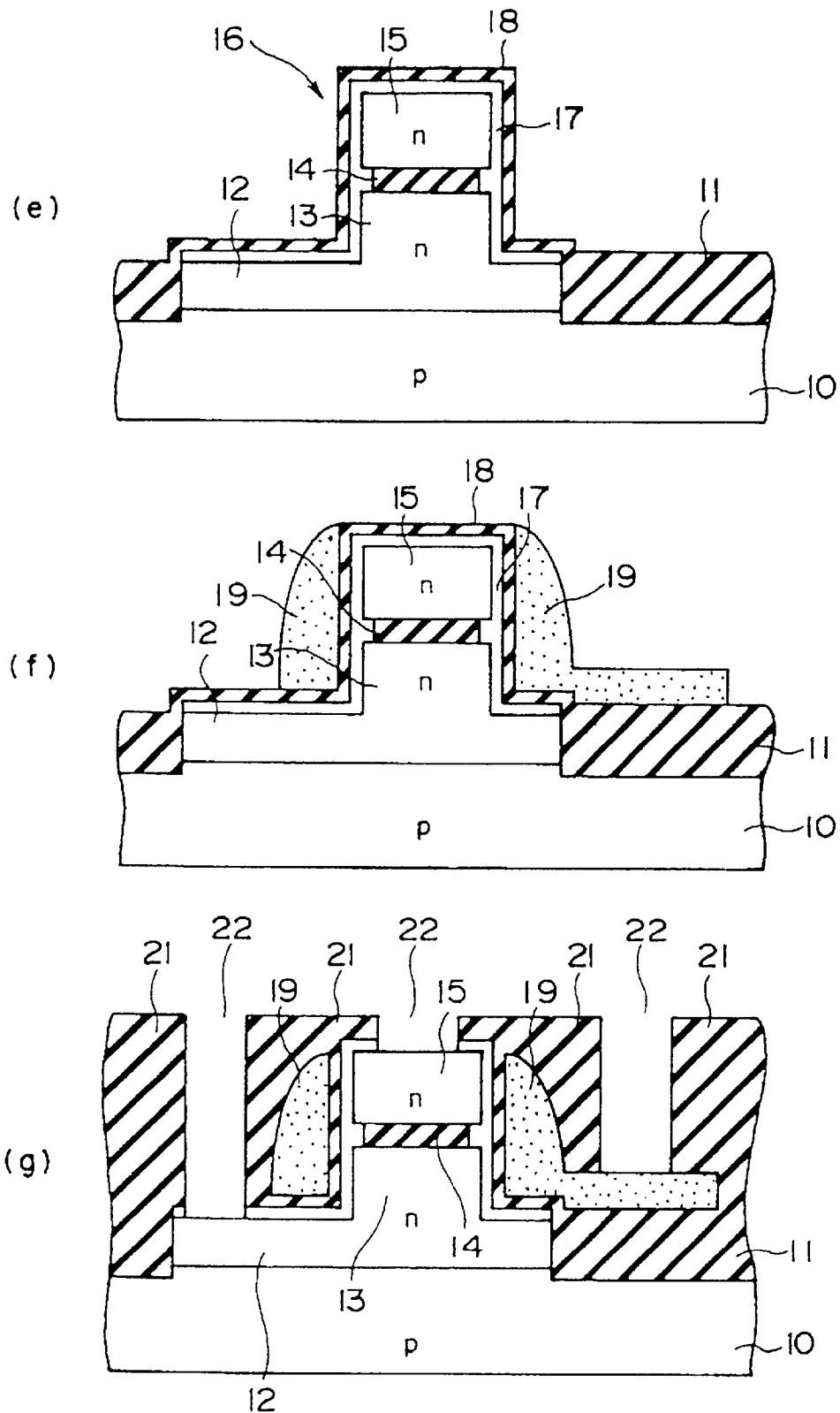

First, as shown in FIG. 2a, isolation regions 11 are formed in the p-type silicon substrate 10, for example, by a trench isolation method. Then, arsenic (As) ions are implanted into the surface of the substrate 10, for example, at 50 keV and at $6.0\times10^{15}$ cm$^{-2}$, thereby forming the n-type diffusion layer region 12.

Then, as shown in FIG. 2b, after the n-type silicon layer 13 having a thickness of 100 nanometers is formed over the entire surface of the substrate 10, for example, by a low pressure chemical vapor deposition (LPCVD) process, arsenic (As) ions are implanted into the silicon layer 13, for example, at 20 keV and at $6.0\times10^{15}$ cm$^{-2}$. Afterwards, the silicon oxide film 14 having a thickness of 50 nanometers is formed over the n-type silicon layer 13, for example, by an LPCVD process. Subsequently, after the n-type silicon layer 15 having a thickness of 100 nanometers is formed over the buried insulation film 14, for example, by an LPCVD process, arsenic (As) ions are implanted into this silicon layer 15 at 20 keV and at $5.0\times10^{15}$ cm$^{-2}$. Then, the obtained structure is subjected to heating for impurity activation.

In the above-described process, instead of implanting arsenic (As) ions after the formation of the silicon layer 13, a silicon layer which contains approximately $3.0\times10^{20}$ cm$^{-3}$ of phosphorus (P) may be formed, for example, by an LPCVD process. Similarly, instead of implanting arsenic (As) ions after the formation of the silicon layer 15, a silicon layer which contains approximately $3.0\times10^{20}$ cm$^{-3}$ of P may be formed, for example, by an LPCVD process. Alternatively, the silicon layers 13 and 15 may be recrystallized after the silicon layer 13, the silicon oxide film 14 and the silicon layer 15 are stacked.

Then, as shown in FIG. 2c, the columnar structure portion 16 is formed by etching the silicon layer 15, the silicon oxide film 14 and the silicon layer 13, for example, by reactive ion etching (RIE).

Then, as shown in FIG. 2d, the silicon oxide film 14 is partly removed, for example, by an ammonium fluoride treatment. Thus, the silicon oxide film 14 is recessed or set back to a slight extent from the side surface of the columnar structure portion 16, in order to enable a good epitaxial growth to be effected at the next process.

Then, as shown in FIG. 2e, the silicon layer 17 having a thickness of 5 nanometers is formed over all the surfaces of the columnar structure portion 16 and the top surface of the n-type diffusion layer region 12, for example, by epitaxial growth. Subsequently, the silicon oxide film 18 having a thickness of 2 nanometers is formed, for example, by oxidizing the surface of the silicon layer 17 in a 10% HCl atmosphere at 800° C.

During the formation of the silicon layer 17, an LPCVD process may be used instead of epitaxial growth. In this case, since the silicon layer 17 is not formed as a single-crystal layer, the silicon layer 17 may be recrystallized if necessary. If an LPCVD process is used, the removing of part of the silicon oxide film 14 as shown in FIG. 2d may also be omitted.

Then, as shown in FIG. 2f, after a polycrystalline silicon film having a thickness of 200 nanometers is deposited, for example, by an LPCVD process, the gate electrode 19 is formed by applying a treatment such as an RIE process to the polycrystalline silicon film. If a predetermined form of resist pattern is formed by, for example, photolithography prior to the RIE, the polycrystalline silicon film can be left even in a region other than the side wall of the columnar structure portion 16.

Then, as shown in FIG. 2g, the silicon oxide film 21 is deposited to a thickness of 500 nanometers, for example, by a chemical vapor deposition (CVD) process, and contact holes 22 are formed, for example, by an RIE process.

Then, an aluminum film which contains 1% silicon is deposited, for example, by a sputtering method and the interconnecting layer 23 is formed by patterning, whereby the above-described structure shown in FIG. 1 is obtained. Subsequently, a semiconductor device is finished by forming a passivation film and the like in a manner similar to that adopted in the conventional semiconductor device manufacturing method.

As is apparent from the above description, according to the first embodiment, in the field-effect transistor of vertical columnar structure, the depth of its channel region can be made substantially shallow by forming the silicon oxide film 14 as a buried field between the n-type silicon layers 13 and 15, one of which constitutes a source region and the other of which constitutes a drain region. Accordingly, punch-through can be restrained even if the impurity concentration in the semiconductor of the channel region is not increased. In addition, since neither of the source and drain regions in this case has a region made of an insulation material similar to those of the conventional structure, no increases in the parasitic resistances of elements are incurred. Accordingly, it is possible to restrain short channel effects without impairing the operating speeds of the elements, and it is possible to realize higher operating speeds and higher performance.

It is to be noted that the description of the first embodiment has referred to an n-type field-effect transistor. However, if the conductivity type of an impurity is made opposite, a p-type field-effect transistor can be constructed in substantially the same manner, and effects similar to those of the above-described first embodiment can be obtained. Moreover, if a process such as photolithography is used to carry out selective introduction of an impurity into a particular region of a substrate only, a complementary field-effect transistor can be constructed. In addition, it is possible to achieve effects similar to those of the first embodiment not only in a case which uses only field-effect transistors having vertical columnar structure, but also in a case where field-effect transistors having vertical columnar structure according to the first embodiment are formed as part of a semiconductor device which includes active elements, such as planar field-effect transistors or bipolar transistors, and passive elements, such as resistors, inductors and capacitors. Moreover, even if an SOI substrate is used for such a field-effect transistor having vertical columnar structure, similar effects can be obtained.

Although arsenic (As) is used as an impurity for forming the n-type silicon layer in the first embodiment, another impurity of the group III may also be used as an impurity for forming the n-type silicon layer. Moreover, even if a compound containing an impurity is introduced, effects similar to those of the first embodiment can be obtained. In addition, although the process of ion implantation is described for the introduction of an impurity in the first embodiment, the introduction of an impurity may also be effected by using another process, such as solid phase diffusion or vapor phase diffusion. Otherwise, another method, such as deposition of semiconductors each containing an impurity, may be used.

Polycrystalline silicon is described for the gate electrode in the first embodiment. However, effects similar to those of the first embodiment can still be obtained if another metal, a metal silicide or a stacked structure of such materials, is used. In addition, although an oxide film due to thermal oxidation is described as the gate insulating film in the first embodiment, an oxide nitride film or another stacked insulation film may also be used. In addition, even if a high dielectric constant film is used as the gate insulating film, similar effects can be obtained. Moreover, if elements each using a ferroelectric film as its gate insulating film are formed, effects similar to those of the first embodiment can still be obtained.

Deposited silicon oxide is described for the buried insulation film inside the channel region in the first embodiment, but similar effects to those can be obtained by forming the buried insulation film by oxidizing the underlying silicon layer. Moreover, if an insulation material other than silicon oxide is used to form buried insulation film, effects similar to those of the first embodiment can still be obtained.

In the first embodiment, a trench isolation method is described for isolation. However, effects similar to those of the first embodiment can still be obtained if the isolation of elements is implemented by a local oxidation of silicon (LOCOS) method or a mesa isolation method. Moreover, although the isolation is described in the first embodiment as being effected to before the columnar structure portion is constructed, isolation may also be effected after the columnar structure portion is constructed.

In the above-described first embodiment, a well is not formed in the region in which the field-effect transistor having a vertical columnar structure is formed. However, even if a well is formed in the region in which the field-effect transistor having a vertical columnar structure is formed, effects similar to those of the first embodiment can be obtained. Moreover, effects similar to those of the first embodiment can also be obtained if silicidation is effected.

Although a barrier metal for forming an interconnecting metal film is described in the first embodiment, similar effects can still be obtained if a layer of barrier metal is provided between an interconnecting metal film and silicon. Moreover, if a layer of interconnecting metal or barrier metal is provided after a metal silicide is formed over the surface of a silicon layer formed inside each interconnecting hole, effects similar to those of the first embodiment can be obtained.

In the above-described first embodiment, an interconnecting line is formed by forming a metal film and patterning the same. However, if interconnecting lines are formed by a damascene process, effects similar to those of the first embodiment can be obtained. Moreover, if the filling of contact holes is by growing high melting point metal in contact holes, effects similar to those of the first embodiment can still be obtained. In addition, in the first embodiment, a silicon oxide film is used as an interlayer insulating film. However, if a material other than silicon oxide, such as a low dielectric constant material, is used for the interlayer insulating film, effects similar to those of the first embodiment can still be obtained.

Figure 3:
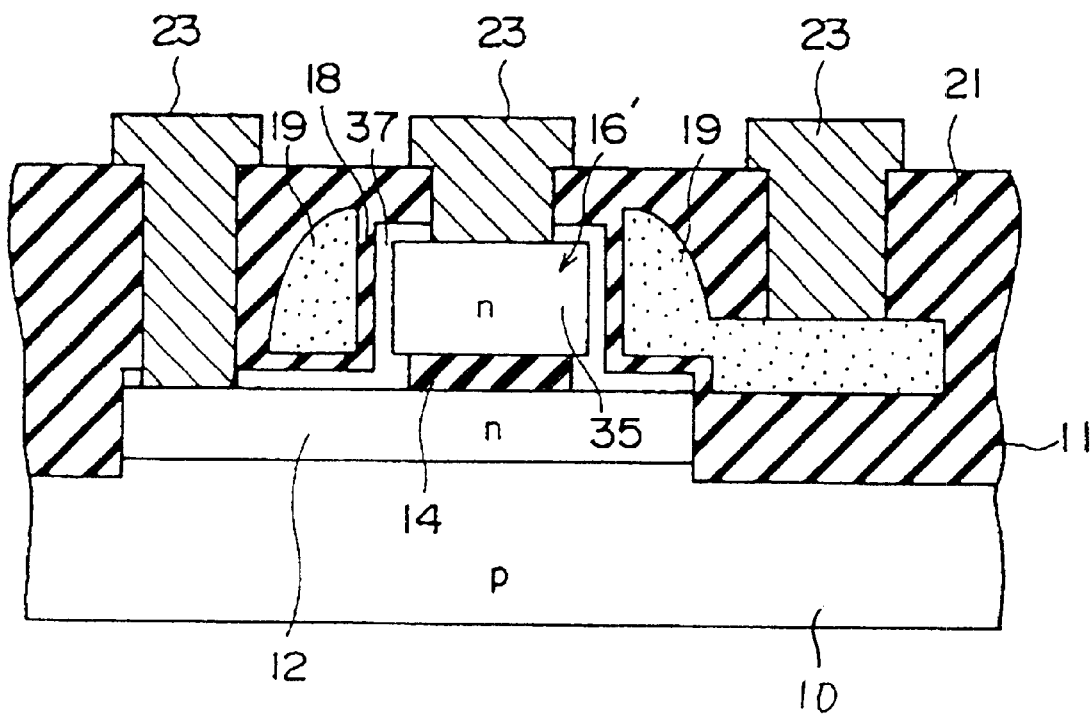
FIG. 3 is a cross-sectional view of an element including a field-effect transistor having a vertical columnar structure according to a second embodiment of the present invention.

FIG. 3 is a cross-sectional view of an element including a field-effect transistor having a vertical columnar structure according to a second embodiment of the present invention. In FIG. 3, identical reference numerals are used to denote portions identical to the corresponding portions shown in FIG. 1, and the detailed description of the same portions is omitted.

The second embodiment differs from the above-described first embodiment in that the n-type silicon layer 13 is omitted and only the n-type diffusion layer region 12 of the substrate 10 is used as a source region. Specifically, a columnar structure portion 16' in which the silicon oxide film 14 and a first semiconductor layer 35 are stacked is formed over the n-type diffusion layer region 12, and a second semiconductor layer 37 is formed over the entire side surface of the columnar structure portion 16'. The first semiconductor layer 35 may be, for example, an n-type silicon layer, and is referred to hereinafter as "n-type silicon layer 35." The second semiconductor layer 37 may be, for example, a silicon layer, and is hereinafter referred to as "silicon layer 37." The construction of the portions other than the aforementioned portions is substantially identical to that shown in FIG. 1.

A method of manufacturing the field-effect transistor having a vertical columnar structure according to the second embodiment is described below with reference to FIGS. 4a to 4d, which are cross-sectional views of the process of manufacturing the field effect transistor of FIG. 3 according to the second embodiment of the present invention.

First, as shown in FIG. 2a, in a manner similar to that described previously in connection its with the first embodiment, the isolation regions 11 are formed in the p-type silicon substrate 10 and the n-type diffusion layer region 12 is formed by the implantation of arsenic (As) ions.

Figure 4:
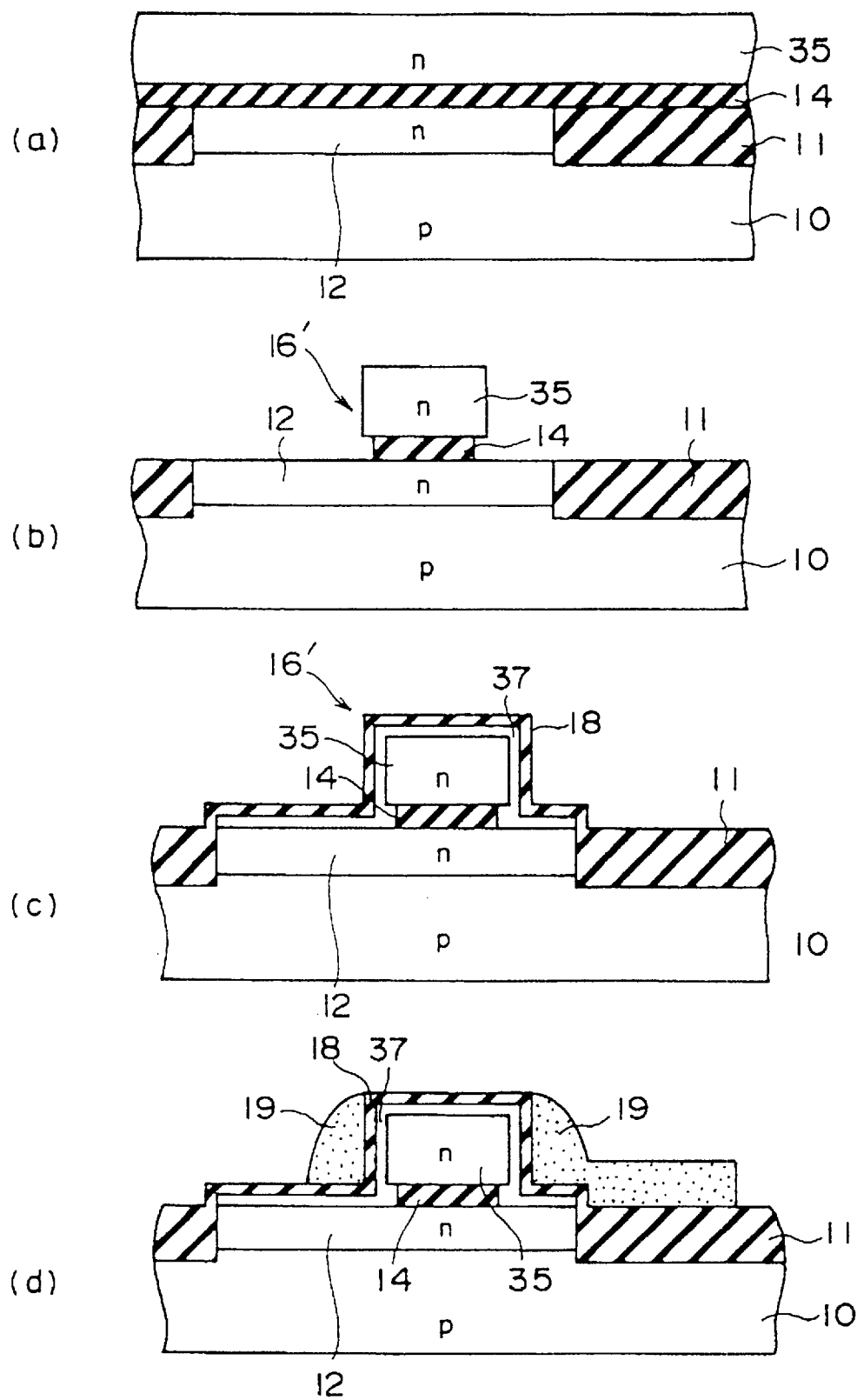
FIGS. 4a to 4d are cross-sectional views of the process of manufacturing the field-effect transistor according to the second embodiment of the present invention.

Then, as shown in FIG. 4a, the silicon oxide film 14 having a thickness of 50 nanometers is formed over the entire surface of the substrate 10, for example, by an LPCVD process. Subsequently, after the silicon layer 35 having a thickness of 100 nanometers is formed over the silicon oxide film 14, for example, by an LPCVD process, arsenic (As) ions are implanted into the silicon layer 35 at 20 keV and at $5.0 \times 10^{15}$ cm$^{-2}$. Then, the obtained structure is subjected to heating for impurity activation.

In the above-described process, instead of implanting arsenic (As) ions after the formation of the silicon layer 35, a silicon layer which contains approximately $3.0 \times 10^{20}$ cm$^{-3}$ of P may be formed, for example, by an LPCVD process. Otherwise, although either of the above-described methods may be used, the silicon layer 35 may be recrystallized after the silicon oxide film 14 and the silicon layer 35 are stacked.

Then, as shown in FIG. 4b, the columnar structure portion 16' is formed by etching the silicon layer 35 and the silicon oxide film 14, for example, by RIE. Then, the silicon oxide film 14 is partly removed, for example, by an ammonium fluoride treatment. Thus, the silicon oxide film 14 is recessed or set back to a slight extent from the side surface of the columnar structure portion 16', in order to enable a good epitaxial growth to be effected at the next process.

Then, as shown in FIG. 4c, the silicon layer 37 having a thickness of 5 nanometers is formed over all the surfaces of the columnar structure portion 16', for example, by epitaxial growth. Subsequently, the silicon oxide film 18 having a thickness of 2 nanometers is formed, for example, by oxidizing the surface of the silicon layer 37 in a 10% HCl atmosphere at 800° C.

Here, an LPCVD process may also be used for the formation of the silicon layer 37 instead of epitaxial growth. In this case, since the silicon layer 37 is not formed as a single-crystal layer, the silicon layer 37 may be recrystallized if necessary. If a process such as an LPCVD process is used, the removing of part of the silicon oxide film 14 as shown in FIG. 4b may also be omitted.

Then, as shown in FIG. 4d, after a polycrystalline silicon film having a thickness of 200 nanometers is deposited, for example, by an LPCVD process, the gate electrode 19 is formed, for example, by RIE to the polycrystalline silicon film. If a predetermined form of resist pattern is formed, for example, by photolithography prior to the RIE, the polycrystalline silicon film can easily be left even in a region other than the side wall of the columnar structure portion 16'.

Subsequently, the silicon oxide film 21 is deposited as an interlayer insulating film, and the contact holes 22 are formed by an RIE process, in a manner similar to that described previously in connection with the first embodiment. Then, the interconnecting layer 23 made from an aluminum film which contains 1% silicon is formed, thus providing the structure shown in FIG. 3.

In the above-described construction, by forming the silicon oxide film 14 in the state of being buried in the columnar structure portion 16', it is possible to make the depth of its channel region substantially shallow without making the source and drain regions shallow. It is thus possible to obtain effects similar to those of the first embodiment. In addition, modifications similar to the modifications of the first embodiment described above may also be applied to the second embodiment.

FIGS. 5a to 5h are cross-sectional views showing a method of manufacturing a field-effect transistor having a vertical columnar structure according to a third embodiment of the present invention. In FIGS. 5a to 5h, identical reference numerals are used to denote portions identical to the corresponding portions shown in FIGS. 2a to 2g, and the detailed description of the same portions is omitted.

First, as shown in FIG. 2a, the isolation regions 11 are formed in the p-type silicon substrate 10, and the n-type diffusion layer region 12 is formed by the implantation of arsenic (As) ions, in a manner similar to that described previously in connection with the first embodiment.

Figure 5:
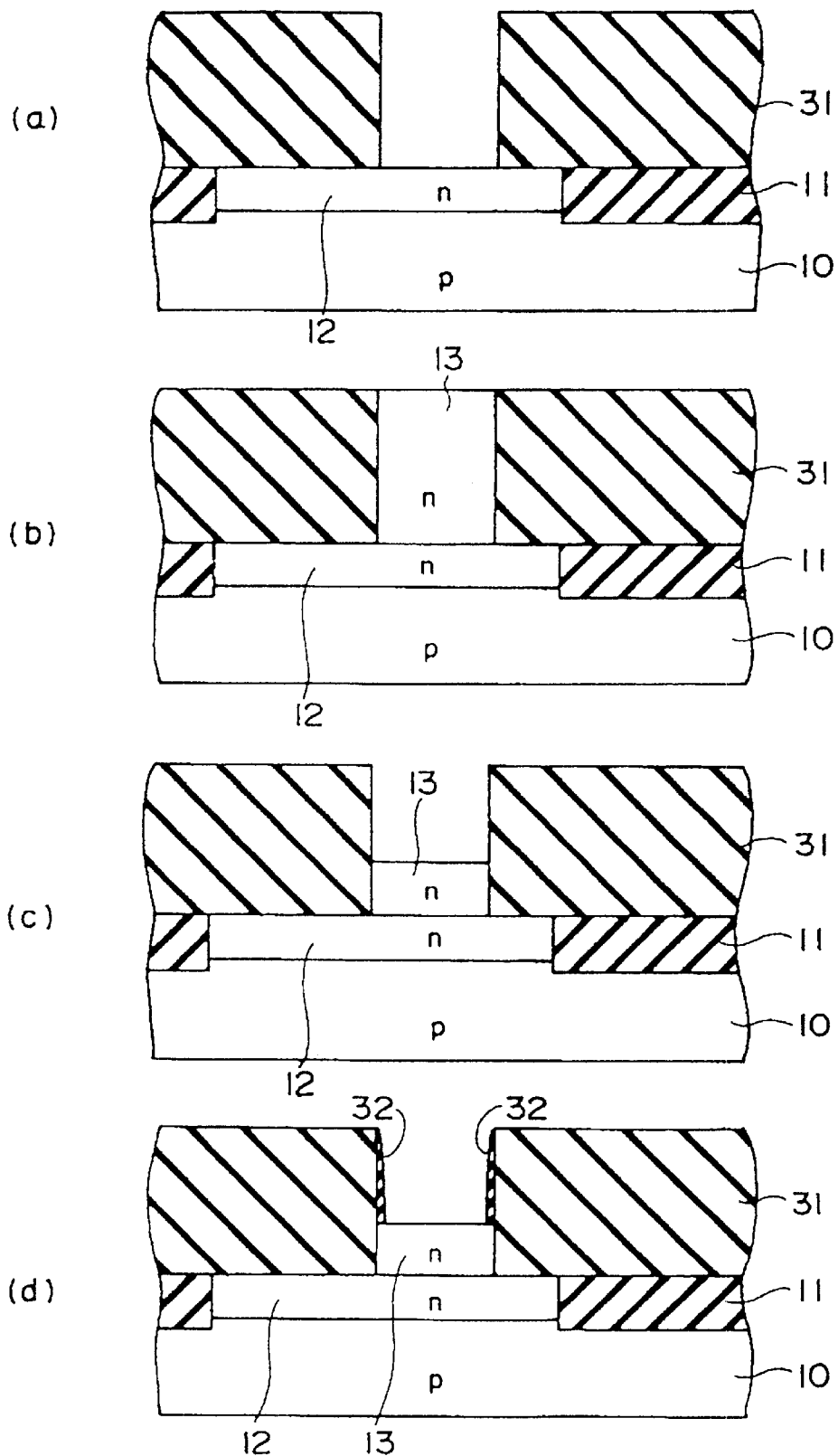
FIGS. 5a to 5h are cross-sectional views of the process of manufacturing a field-effect transistor according to a third embodiment of the present invention.
Figure 5:
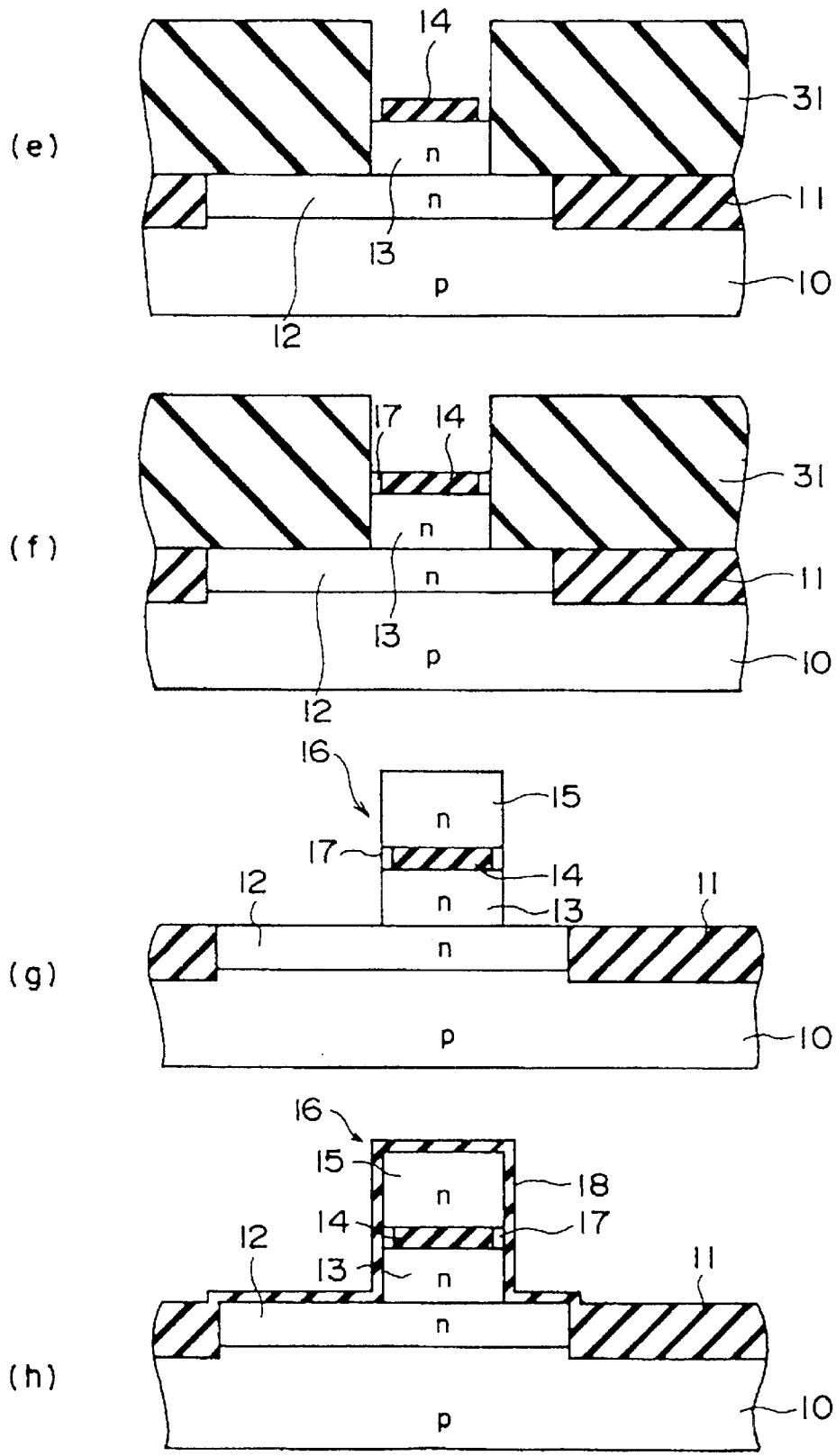

Then, as shown in FIG. 5a, a silicon oxide film 31 having a thickness of 200 nanometers is formed over the entire surface of the substrate 10, for example, by an LPCVD process. Subsequently, the silicon oxide film 31 is partly removed, for example, by an RIE process, and an opening is formed in a region in which to form the field-effect transistor having a vertical columnar structure.

Then, as shown in FIG. 5b, the silicon layer 13 having a thickness of 300 nanometers is formed over the entire surface of the substrate 10, for example, by an LPCVD process, and arsenic (As) ions are implanted into the silicon layer 13 at 20 keV and at $5.0 \times 10^{15}$ cm$^{-2}$. Then, the surface of the silicon layer 13 is flattened, for example, by a CMP process.

In this process, instead of implanting arsenic (As) ions after the formation of the silicon layer 13, a silicon layer of thickness 300 nanometers which contains approximately $3.0 \times 10^{20}$ cm$^{-3}$ of P may be formed, for example, by an LPCVD process.

Then, as shown in FIG. 5c, the silicon layer 13 is etched to a reduced portion, for example, by RIE, so that part of the silicon layer 13 is left at the bottom of the opening formed in the silicon oxide film 31.

Then, as shown in FIG. 5d, a silicon nitride film having a thickness of 10 nanometers is deposited, for example, by an LPCVD process. Next, the silicon nitride film is etched back, for example, by RIE, to form a side wall insulating film 32 over the side surface of the opening of the silicon oxide film 31.

Then, as shown in FIG. 5e, the silicon oxide film 14 of thickness 50 nanometers is formed by oxidizing the surface of the silicon layer 13, for example, in a 10% HCl atmosphere at 900° C. After that, the side wall insulating film 32 is removed, for example, by thermal phosphoric acid treatment.

Then, as shown in FIG. 5f, the silicon layer 17 is grown to a portion above the exposed portion of the silicon layer 13, for example, by epitaxial growth.

Then, as shown in FIG. 5g, the silicon layer 15 having a thickness of 100 nanometers is formed over the silicon oxide film 14 and the silicon layer 17, for example, by an LPCVD process. Then, after arsenic (As) ions are implanted into the silicon layer 15 at 20 keV and at $5.0 \times 10^{15}$ cm$^{-2}$, the n-type silicon layer 15 is subjected to heating. Then, after the surface of the silicon layer 15 is flattened, the silicon oxide film 31 is removed, for example, by an ammonium fluoride treatment.

In this process, the columnar structure portion 16 is formed similarly to that of the first embodiment.

In this process, instead of implanting arsenic (As) ions after the formation of the silicon layer 15, a silicon layer which contains approximately $3.0 \times 10^{20}$ cm$^{-3}$ of P may be formed over the silicon oxide film 14, for example, by an LPCVD process. Otherwise, although either of the above-described methods may be used, the silicon layers 13, 15 and 17 may be recrystallized after the silicon layer 13, the insulation film 14, the silicon layer 15 and the silicon layer 17 are formed.

Then, as shown in FIG. 5h, the silicon oxide film 18 of thickness 2 nanometers is formed by oxidizing the surfaces of the silicon layers 13, 15 and 17, for example, in a 10% HCl atmosphere at 800° C.

The subsequent processes are identical to those shown in FIGS. 2f and 2g of the first embodiment, whereby the structure shown in FIG. 1 is obtained by forming the gate electrode 19, the interlayer insulating film 21 and the interconnecting layer 23. However, the silicon layer 17, which serves as the third semiconductor layer, is not formed over the entire side surface of the columnar structure portion 16 but in the set-back portion of the silicon oxide film 14, e.g., in only the channel region of the field-effect transistor. Even with this construction, it is possible to obtain effects similar to those of the first embodiment.

FIGS. 6a to 6f are cross-sectional views showing a method of manufacturing a field-effect transistor having a vertical columnar structure according to a fourth embodiment of the present invention. In FIGS. 6a to 6f, identical reference numerals are used to denote portions identical to the corresponding portions shown in FIGS. 2a to 2g, and the detailed description of the same portions is omitted.

First, as shown in FIG. 2a, in a manner similar to that described previously in connection with the first embodiment, the isolation regions 11 are formed in the p-type silicon substrate 10 and the n-type diffusion layer region 12 is formed, for example, by the implantation of arsenic (As) ions.

Figure 6:
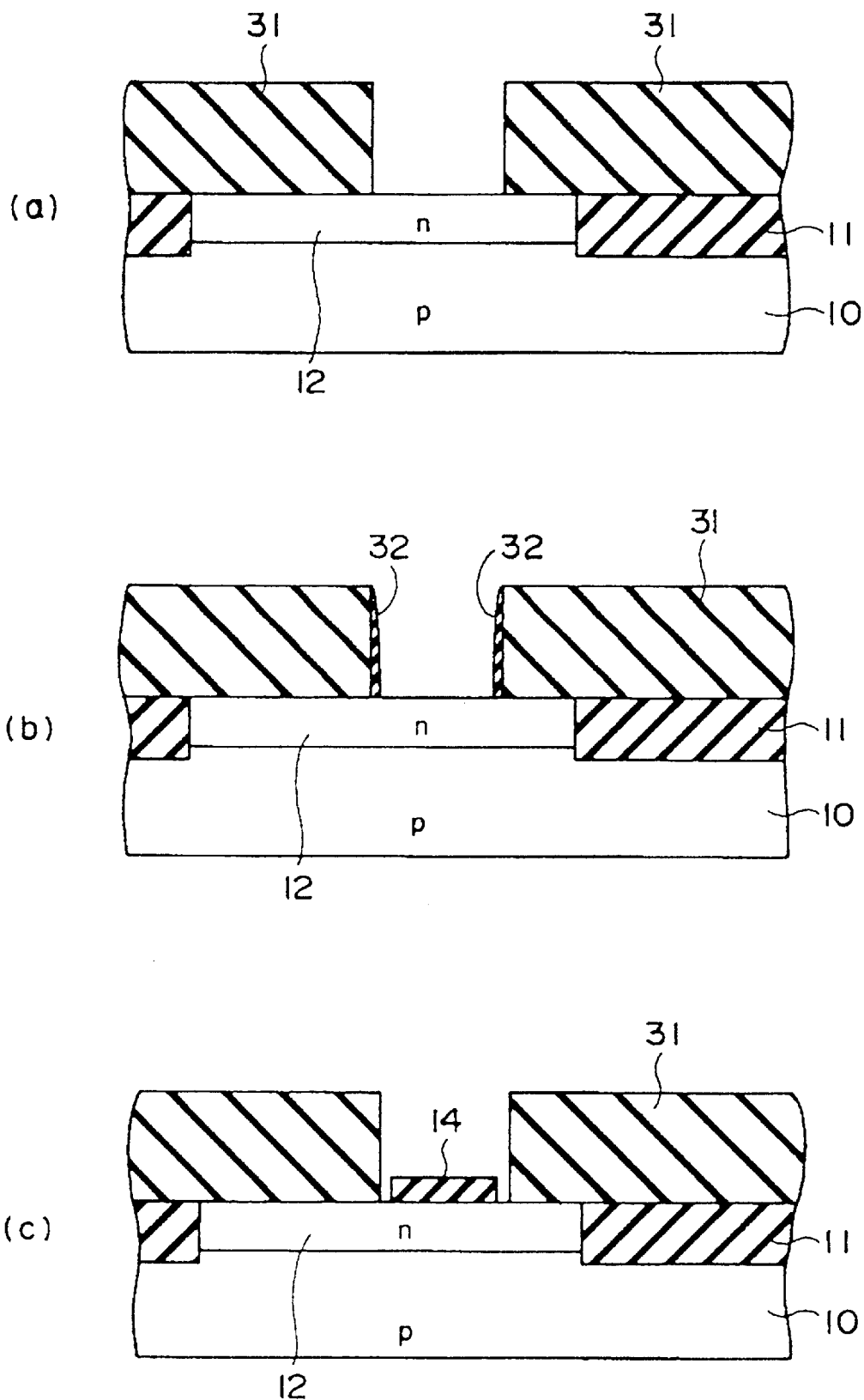
FIGS. 6a to 6f are cross-sectional views of the process of manufacturing a field-effect transistor according to a fourth embodiment of the present invention.
Figure 6:
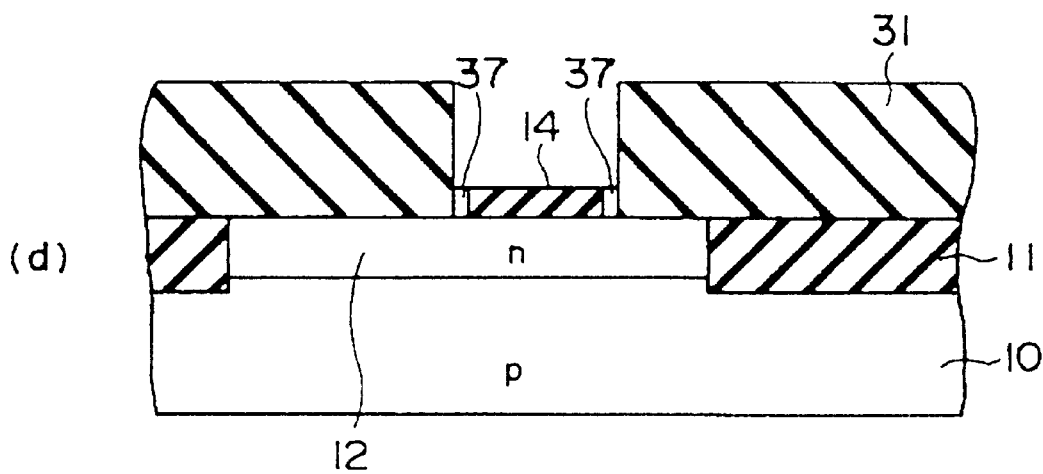
Figure 6:
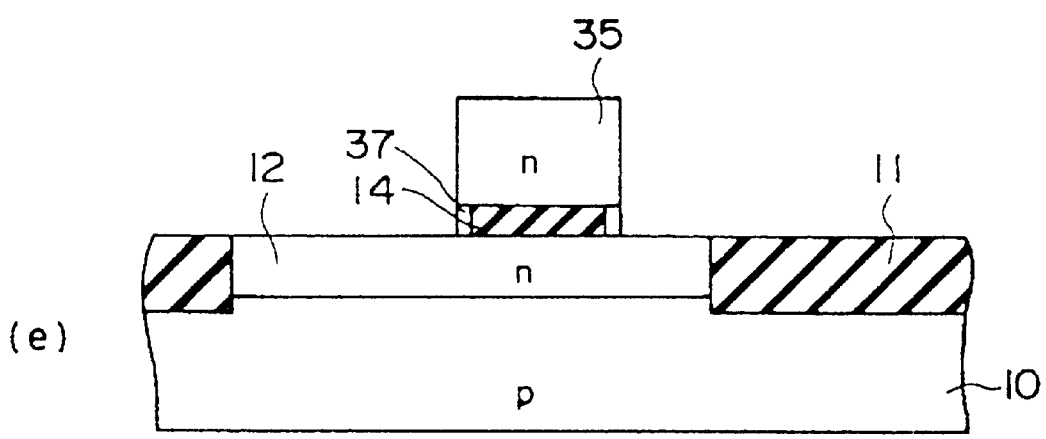
Figure 6:
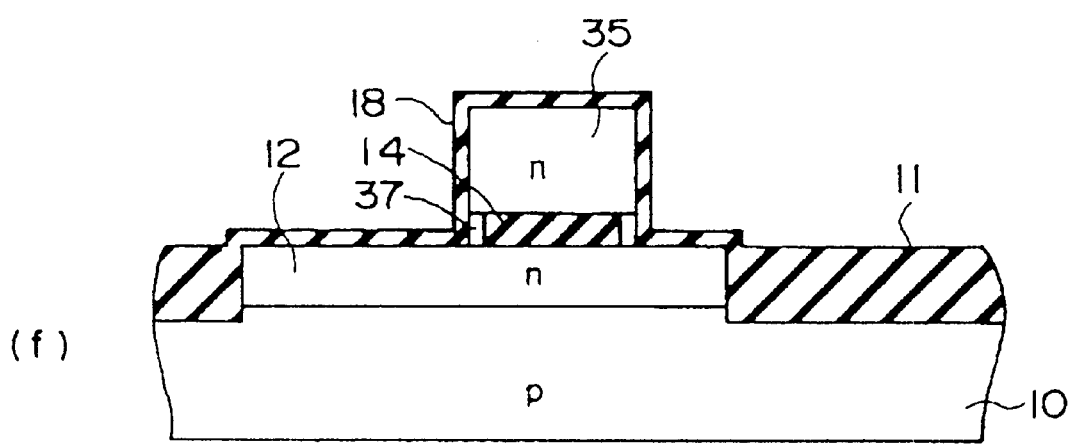

Then, as shown in FIG. 6a, the silicon oxide film 31 having a thickness of 200 nanometers is formed over the entire surface of the substrate 10, for example, by an LPCVD process. Subsequently, the silicon oxide film 31 is partly removed, for example, by an RIE process, and an opening is formed in a region in which the field-effect transistor having a vertical columnar structure can be formed.

Then, as shown in FIG. 6b, after a silicon nitride film having a thickness of 10 nanometers is deposited over the entire surface of the substrate 10, for example, by an LPCVD process, the silicon nitride film is etched back, for example, by RIE, to form the side wall insulating film 32 to over the side surface of the opening of the silicon oxide film 31.

Then, as shown in FIG. 6c, the silicon oxide film 14 having a thickness of 50 nanometers is formed by oxidizing the surface of the n-type diffusion layer region 12, for example, in a 10% HCl atmosphere at 900° C. Afterward, the side wall insulating film 32 is removed, for example, by thermal phosphoric acid treatment.

Then, as shown in FIG. 6d, the silicon layer 37 is grown to a portion above the exposed portion of the n-type diffusion layer region 12, for example, by epitaxial growth.

Then, as shown in FIG. 6e, the silicon layer 35 having a thickness of 100 nanometers is formed over the silicon oxide film 14 and the silicon layer 37, for example, by an LPCVD process, and arsenic ions are implanted into the silicon layer 35 at 20 keV and at $5.0 \times 10^{15}$ cm$^{-2}$. Then, the obtained structure is subjected to heating for impurity activation. Then, after the surface of the n-type silicon layer 35 is flattened, for example, by a CMP process, the silicon oxide film 31 is removed, for example, by an ammonium fluoride treatment.

In this process, instead of implanting arsenic (As) ions after the formation of the silicon layer 35, a silicon layer having a thickness of 100 nanometers which contains approximately $3.0 \times 10^{20}$ cm$^{-3}$ of P may be formed over the silicon oxide film 14, for example, by an LPCVD process. Otherwise, although either of the above-described methods may be used, the silicon layer 35 may be recrystallized after the silicon layer 35 is formed.

Then, as shown in FIG. 6f, the silicon oxide film 18 having a thickness of 2 nanometers is formed by oxidizing the surfaces of the n-type diffusion layer region 12, the n-type silicon layer 35 and the silicon layer 37, for example, in a 10% HCl atmosphere at 800° C.

The subsequent processes are identical to those shown in FIGS. 2f and 2g of the first embodiment, whereby the structure shown in FIG. 1 is obtained by forming the gate electrode 19, the interlayer insulating film 21 and the interconnecting layer 23. In this case as well, the silicon layer 37 which serves as the second semiconductor layer is formed in only the set-back portion of the silicon oxide film 14 of the columnar structure portion 16', in a manner similar to that described previously in connection with the third embodiment. Even with this construction, it is possible to obtain effects similar to those of the first embodiment.

Figure 7:
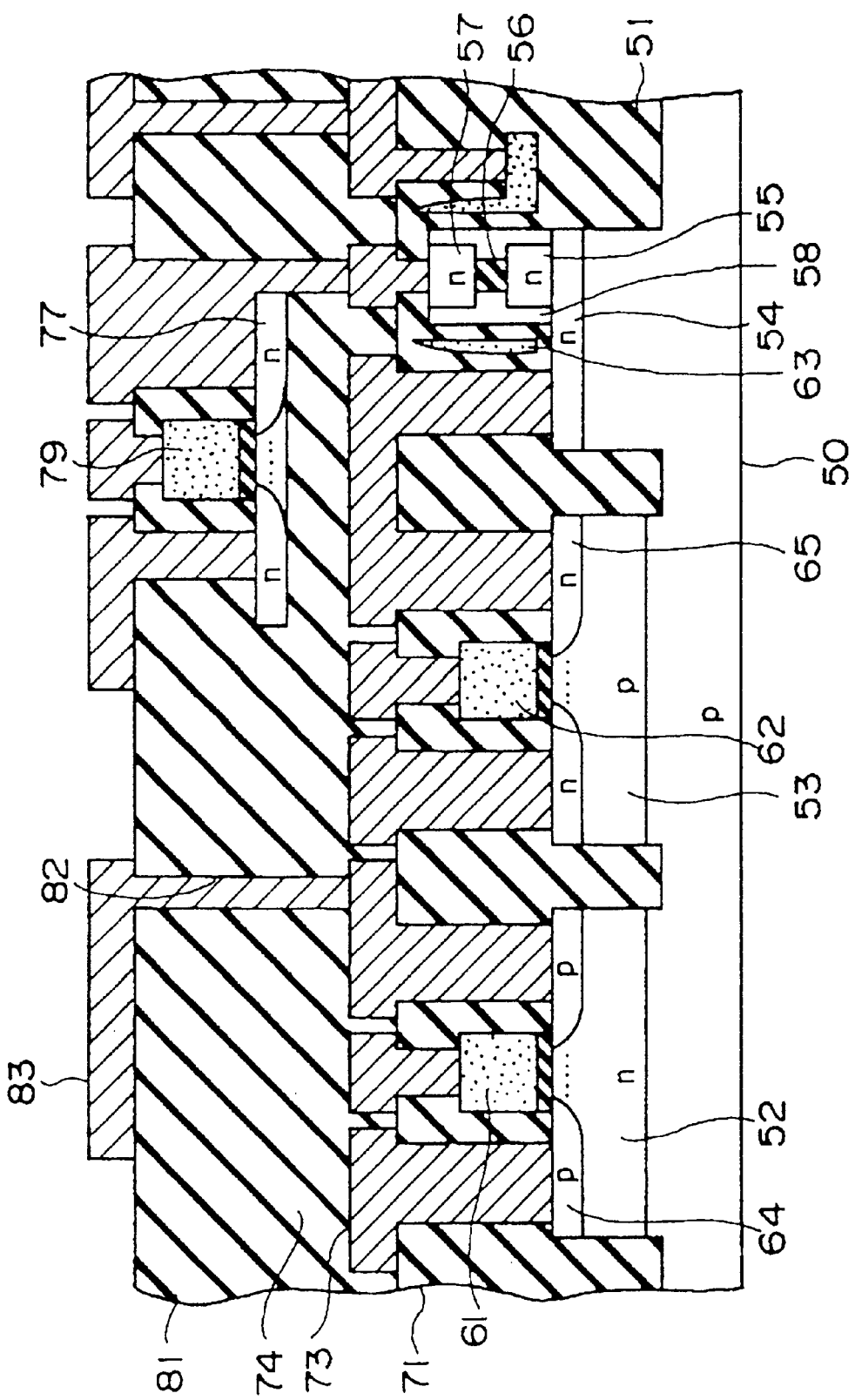
FIG. 7 is a cross-sectional view of an element including a semiconductor integrated circuit according to a fifth embodiment of the present invention.

FIG. 7 is a cross-sectional view of an element having a semiconductor integrated circuit according to a fifth embodiment of the present invention.

In this semiconductor integrated circuit, field-effect transistors are formed over a plurality of surfaces, and a field-effect transistor having a vertical columnar structure is formed to couple these surfaces to each other. Specifically, a p-type field-effect transistor having a gate electrode 61 and an n-type field-effect transistor having a gate electrode 62 are formed in a first element formation layer, and an n-type field-effect transistor having a gate electrode 79 is formed in a second element formation layer. An n-type field-effect transistor having a vertical columnar structure is formed between the first and second element formation layers, and this transistor is connected to the n-type field-effect transistor in the first element formation layer and to the n-type field-effect transistor in the second element formation layer.

A method of manufacturing the semiconductor integrated circuit according to the fifth embodiment is described below with reference to FIGS. 8a to 8l.

Figure 8:
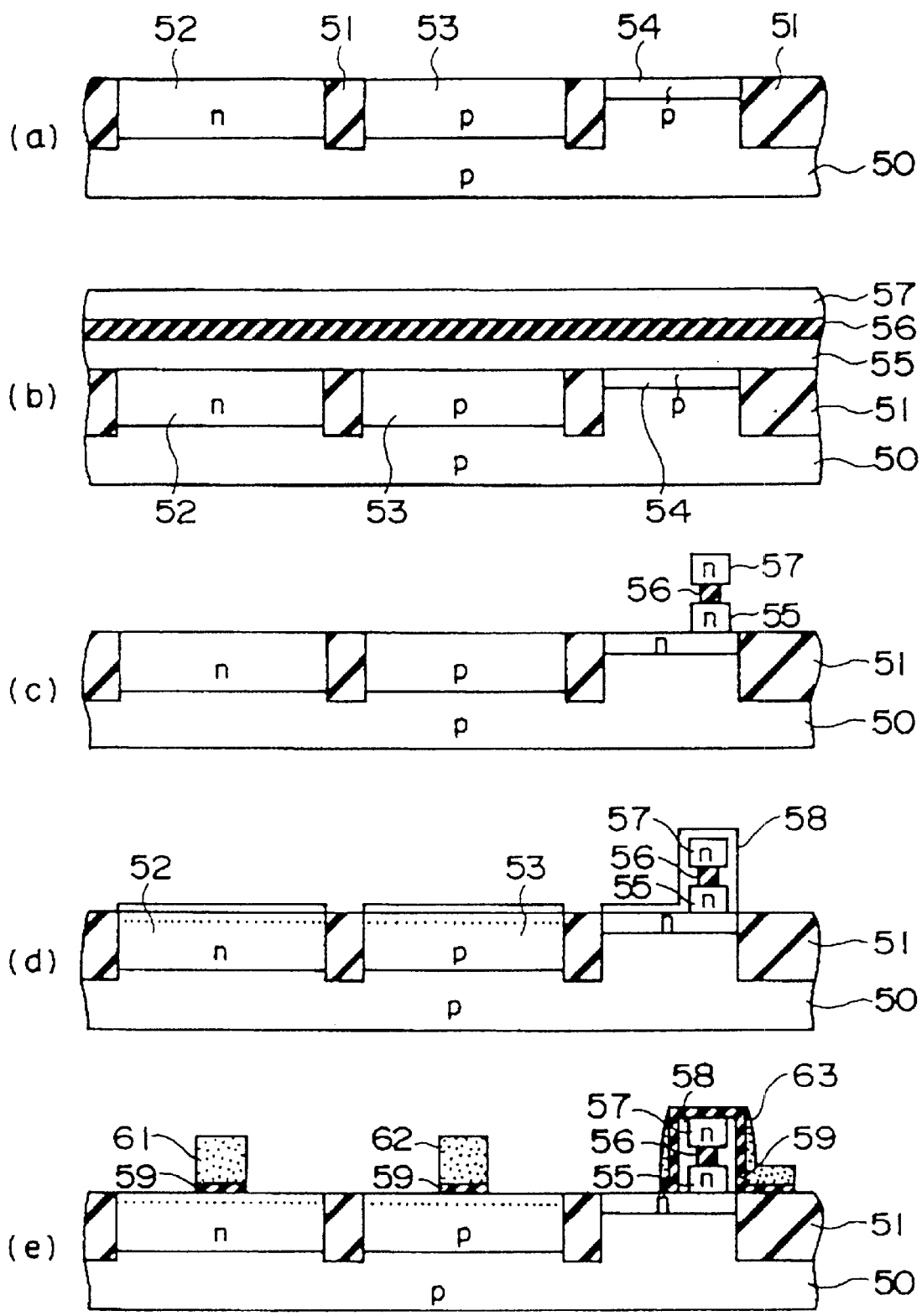
FIGS. 8a to 8l are cross-sectional views of the process of manufacturing the semiconductor integrated circuit according to the fifth embodiment of the present invention.
Figure 8:
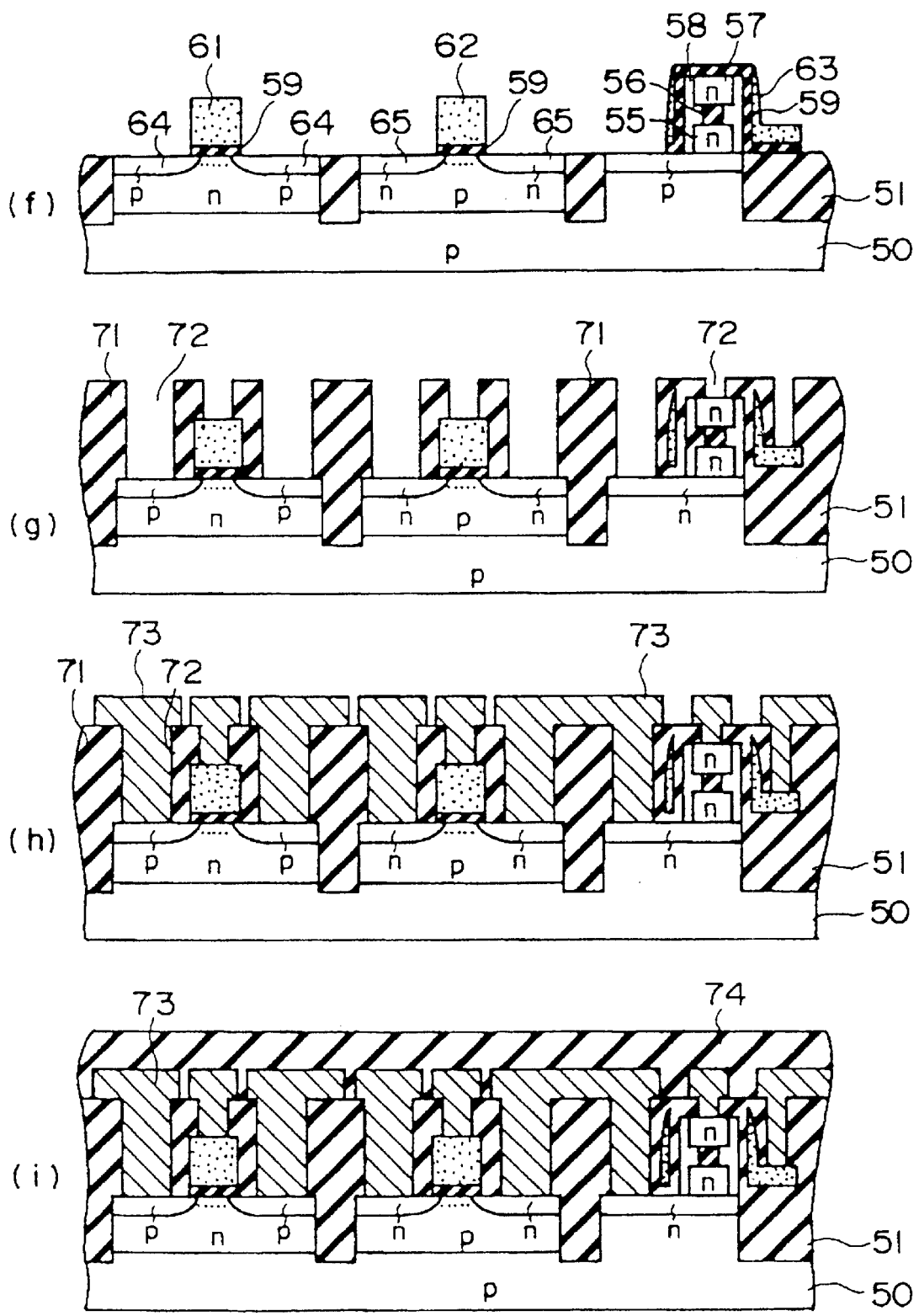
Figure 8:
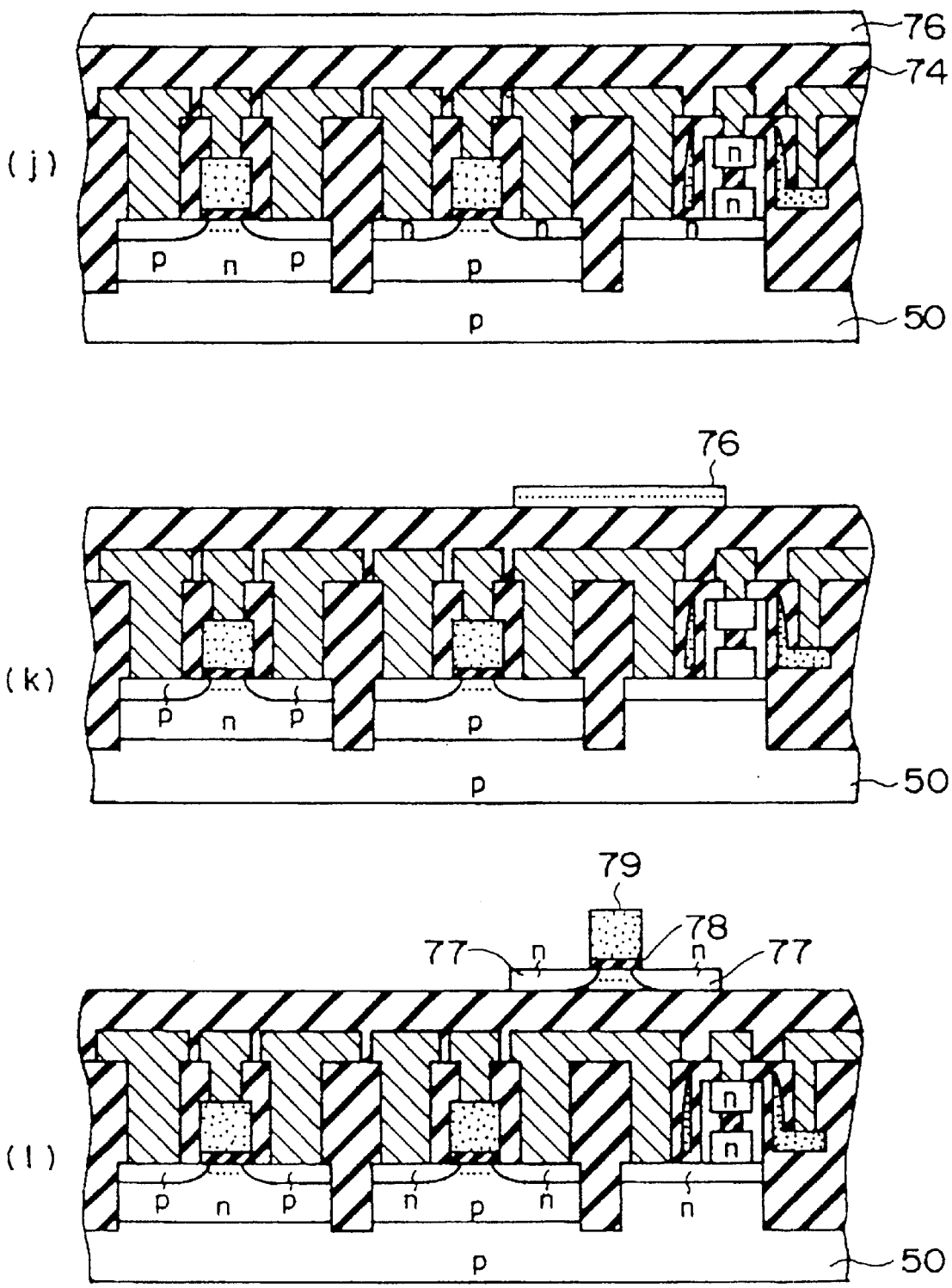

First, as shown in FIG. 8a, isolation regions 51 made of silicon oxide are formed in a p-type silicon substrate 50, for example, by a trench isolation method. Then, boron (B) ions at 100 keV and at $2.0 \times 10^{13}$ cm$^{-2}$ are implanted into regions in which to form p-wells, and P ions at 160 keV and at $6.0 \times 10^{12}$ cm$^{-2}$ are implanted into a region in which to form an n-well. After that, arsenic (As) ions at 50 keV and at $5.0 \times 10^{15}$ cm$^{-2}$ are implanted into a region in which to form a field-effect transistor having a vertical columnar structure. Then, an n-well region 52, a p-well region 53 and an n-well region (n-type diffusion layer region) 54 are formed through heating, for example, for 30 seconds at 1050° C.

Then, as shown in FIG. 8b, after a silicon layer 55 having a thickness of 100 nanometers is formed over the entire surface of the substrate 50, for example, by an LPCVD process, arsenic (As) ions at 20 keV and at $5.0 \times 10^{15}$ cm$^{-2}$ are implanted into this silicon layer 55. After that, a silicon oxide film 56 having a thickness of 50 nanometers is formed over the silicon layer 55, for example, by an LPCVD process. Subsequently, after a silicon layer 57 having a thickness of 100 nanometers is formed over the silicon oxide film 56, for example, by an LPCVD process, arsenic (As) ions at 20 keV and at $5.0 \times 10^{15}$ cm$^{-2}$ are implanted into this silicon layer 57. Then, the obtained structure is subjected to a heating step for the purpose of impurity activation.

In the above-described process, instead of implanting As ions after the formation of the silicon layer 55, a silicon layer of thickness 100 nanometers which contains approximately $3.0 \times 10^{20}$ cm$^{-3}$ of P may be formed, for example, by an LPCVD process. Similarly, instead of implanting As ions after the formation of the silicon layer 57, a silicon layer having a thickness of 100 nanometers which contains approximately $3.0 \times 10^{20}$ cm$^{-3}$ of P may be formed over the silicon oxide film 56, for example, by an LPCVD process. Otherwise, although any of the above-described methods may be used, the silicon layers 55 and 57 may be recrystallized after they are formed.

Then, as shown in FIG. 8c, a columnar structure portion is formed by etching the silicon layer 57, the silicon oxide film 56 and the silicon layer 55, for example, by an RIE process. Then, the silicon oxide film 56 is partly removed, for example, by an ammonium fluoride treatment.

Then, as shown in FIG. 8d, a silicon layer 58 having a thickness of 5 nanometers is formed over all the surfaces of the columnar structure portion, for example, by epitaxial growth. Subsequently, B ions are implanted into the p-well region 53 at 30 keV and at $1.0 \times 10^{13}$ cm$^{-2}$ for the purpose of obtaining a desired threshold voltage, thereby adjusting the concentration at its channel surface, while P ions are implanted into the n-well region 52 with 150 keV at $1.5 \times 10^{13}$ cm$^{-2}$ for the purpose of obtaining a desired threshold voltage, thereby adjusting the concentration at its channel surface.

In this process, instead of forming the silicon layer 58 by epitaxial growth, a silicon layer of thickness 5 nanometers may be formed over all the surfaces of the columnar structure portion, for example, by an LPCVD process. In this case, since the silicon layer is not formed as a single-crystal layer, the silicon layer may be recrystallized if necessary. If a process such as an LPCVD process is used, the removing of part of the silicon oxide film 56 as shown in FIG. 8c may also be omitted.

Then, as shown in FIG. 8e, a silicon oxide film 59 having a thickness of 3 nanometers is formed as a gate insulating film by oxidizing the surfaces of the silicon substrate 50 and the silicon layer 58, for example, in a 10% HCl atmosphere at 800° C. Then, after a polycrystalline silicon film having a thickness of 200 nanometers is deposited, as by an LPCVD process, the gate electrodes 61, 62 and 63 are formed by applying a treatment such as an RIE process to the polycrystalline silicon film. If a predetermined form of resist pattern is formed by, for example, photolithography prior to the RIE, the polycrystalline silicon film can easily be left even in a region other than the side wall of the columnar structure portion.

Then, as shown in FIG. 8f, for example, arsenic (As) ions (for example, at 30 keV and at $5.0 \times 10^{15}$ cm$^{-2}$) are implanted into a region in which to form an n-type field-effect transistor, and source and drain regions 65 are formed through heating. Moreover, B ions (for example, at 20 keV and at $5.0 \times 10^{15}$ cm$^{-2}$) are implanted into a region in which to form a p-type field-effect transistor, and source and drain regions 64 are formed through heating.

Then, as shown in FIG. 8g, after a silicon oxide film 71 is deposited to a thickness of 600 nanometers as an interlayer insulating film, for example, by a CVD process, contact holes 72 for connection to interconnecting lines are formed, for example, by an RIE process.

Then, as shown in FIG. 8h, an aluminum film which contains 1% silicon is deposited in the contact holes 72 of the silicon oxide film 71 as well as over the silicon oxide film 71, for example, by a sputtering method, and an interconnecting layer 73 is formed, for example, by patterning the aluminum film.

Then, as shown in FIG. 8i, after a tetra-ethyl-ortho-silicate (TEOS) film 74 having a thickness of 700 nanometers is formed over the entire surface of the substrate 50 by a CVD method, the TEOS film 74 is flattened, for example, by a CMP process.

Then, as shown in FIG. 8j, a silicon layer 76 having a thickness of 100 nanometers is formed over the TEOS film 74, for example, by a CVD process, and this silicon layer 76 is recrystallized. Then, the silicon layer 76 is flattened by using a process such as a CMP process.

Then, as shown in FIG. 8k, the silicon layer 76 is patterned, for example, by a RIE process. Subsequently, B ions (for example, at 30 keV and at $2.0 \times 10^{13}$ cm$^{-2}$) are implanted into a p-well forming region of the silicon layer 76, while P ions (for example, at 30 keV and at $6.0 \times 10^{12}$ cm$^{-2}$) are implanted into an n-well forming region of the silicon layer 76. FIG. 8k shows only a p-well region.

Then, B ions are implanted into the p-well region of the silicon layer 76 at 30 keV and at $1.0 \times 10^{13}$ cm$^{-2}$ for obtaining a desired threshold voltage, thereby adjusting the concentration at its channel surface, and P ions (for example, at 160 keV and at $1.5 \times 10^{13}$ cm$^{-2}$) are implanted into n-well regions for obtaining a desired threshold voltage, thereby adjusting the concentration at its channel surface. The obtained structure is subjected to heating, for example, by laser annealing.

Then, as shown in FIG. 8l, a silicon oxide film 78 having a thickness of 5 nanometers is formed over the silicon layer 76 as a gate insulating film, for example, by a CVD process. Then, after a polycrystalline silicon film having a thickness of 200 nanometers is deposited by a process such as a CVD process, a gate electrode 79 is formed, for example, by applying an RIE process to the polycrystalline silicon film. Then, arsenic (As) ions (for example, at 30 keV and at $5.0 \times 10^{15}$ cm$^{-2}$) are implanted into a region in which to form an n-type field-effect transistor, while B ions (for example, at 20 keV and at $5.0 \times 10^{15}$ cm$^{-2}$) are implanted into a region in which to form a p-type field-effect transistor, and source and drain regions 77 are formed through heating.

Subsequently, a TEOS film 81 having a thickness of 700 nanometers is formed by a CVD process, and is then flattened, for example, by a CMP process. After that, a via hole 82 is formed, for example, by an RIE process. Then, an aluminum film which contains 1% silicon is deposited by a sputtering method and an interconnecting layer 83 is formed by patterning, whereby the above-described structure shown in FIG. 7 is obtained. Subsequent to this process, a semiconductor device is finished through a passivation film forming process in a manner similar to that adopted in the conventional semiconductor device manufacturing method.

As is apparent from the above description, according to the fifth embodiment, not only are field-effect transistors having a horizontal structure formed in the first element formation layer and the second element formation layer, but also a field-effect transistor having vertical columnar structure is formed in a region which couples the first and second element formation layers to each other. Accordingly, the scale of integration can be increased to a great extent compared to conventional semiconductor integrated circuits. In addition, the total length of interconnecting lines can be reduced to restrain a decrease in operating speed due to interconnecting delay, whereby a high-performance semiconductor integrated circuit which operates at high speeds can be realized.

In addition, the field-effect transistor having vertical columnar structure according to the fifth embodiment has a structure in which its channel portion has a buried insulation film, similarly to the field-effect transistor according to the first embodiment. Accordingly, it is possible to restrain short channel effects without impairing the operating speeds of elements, and it is possible to improve the operating speeds and the performance of vertical columnar structure transistors.

In the fifth embodiment, it is possible to make various modifications such as those described previously in connection with the first embodiment, and the following modifications are also possible. In the description of the fifth embodiment, reference has been made to an example in which a field-effect transistor and an interconnecting metal are stacked in two layers. However, if a field-effect transistor and an interconnecting metal are not stacked in two layers, effects similar to those of the fifth embodiment can still be obtained.

In addition, in the fifth embodiment, as compared with the interconnecting metal of the first layer, the field-effect transistor of the second layer is formed at a position away from the substrate surface, but even if these metal and transistor are formed in the same plane or the interconnecting metal of the first layer is formed at a position further apart from the substrate surface than is the field-effect transistor of the second layer, effects similar to those of the fifth embodiment can be obtained.

In addition, in the fifth embodiment, the field-effect transistor having a vertical columnar structure is formed in only a field-effect transistor layer of the first layer. However, a layer in which to form the field-effect transistor of vertical columnar structure is not limited to only the first layer. If a field-effect transistor of vertical columnar structure is present in a layer different from the first layer, or if a field-effect transistor having a vertical columnar structure is not present in the first layer of a semiconductor integrated circuit in which field-effect transistors are formed in greater than three layers, effects similar to those of the fifth embodiment can still be obtained.

In the above-described fifth embodiment, the vertical transistor is connected to the n-type horizontal transistor. However, the n-type horizontal transistor is not essential, and the vertical transistor may also be connected to a p-type transistor or another element such as a bipolar transistor.

In the fifth embodiment, arsenic (As) is used as an impurity for forming an n-type semiconductor layer, while boron (B) is used as an impurity for forming a p-type semiconductor layer. However, if another impurity of the group III is used as an impurity for forming an n-type semiconductor layer and another impurity of the group III is used as an impurity for forming a p-type semiconductor layer, effects similar to those of the fifth embodiment can still be obtained. Moreover, if a compound containing an impurity of the group III or V is introduced, effects similar to those of the fifth embodiment can also be obtained.

In the description of the fifth embodiment, reference has been made to only a case in which a planar field-effect transistor has a single drain structure. However, if a planar field-effect transistor has another source/drain structure such as an LDD structure, effects similar to those of the fifth embodiment can still be obtained. Moreover, similar effects can be obtained in the case of an element having a pocket structure or an elevated structure.

In addition, in the fifth embodiment, a well is not formed in the region in which the field-effect transistor of vertical columnar structure is formed. However, if a well is formed in the region in which the field-effect transistor of vertical columnar structure is formed, effects similar to those of the fifth embodiment can still be obtained.

FIGS. 9a to 9e are cross-sectional views showing the process of manufacturing a semiconductor integrated circuit according to a sixth embodiment of the present invention. Incidentally, in FIGS. 9a to 9e, identical reference numerals are used to denote portions identical to the corresponding portions shown in FIGS. 8a to 8l, and the detailed description of the same portions is omitted.

Figure 9:
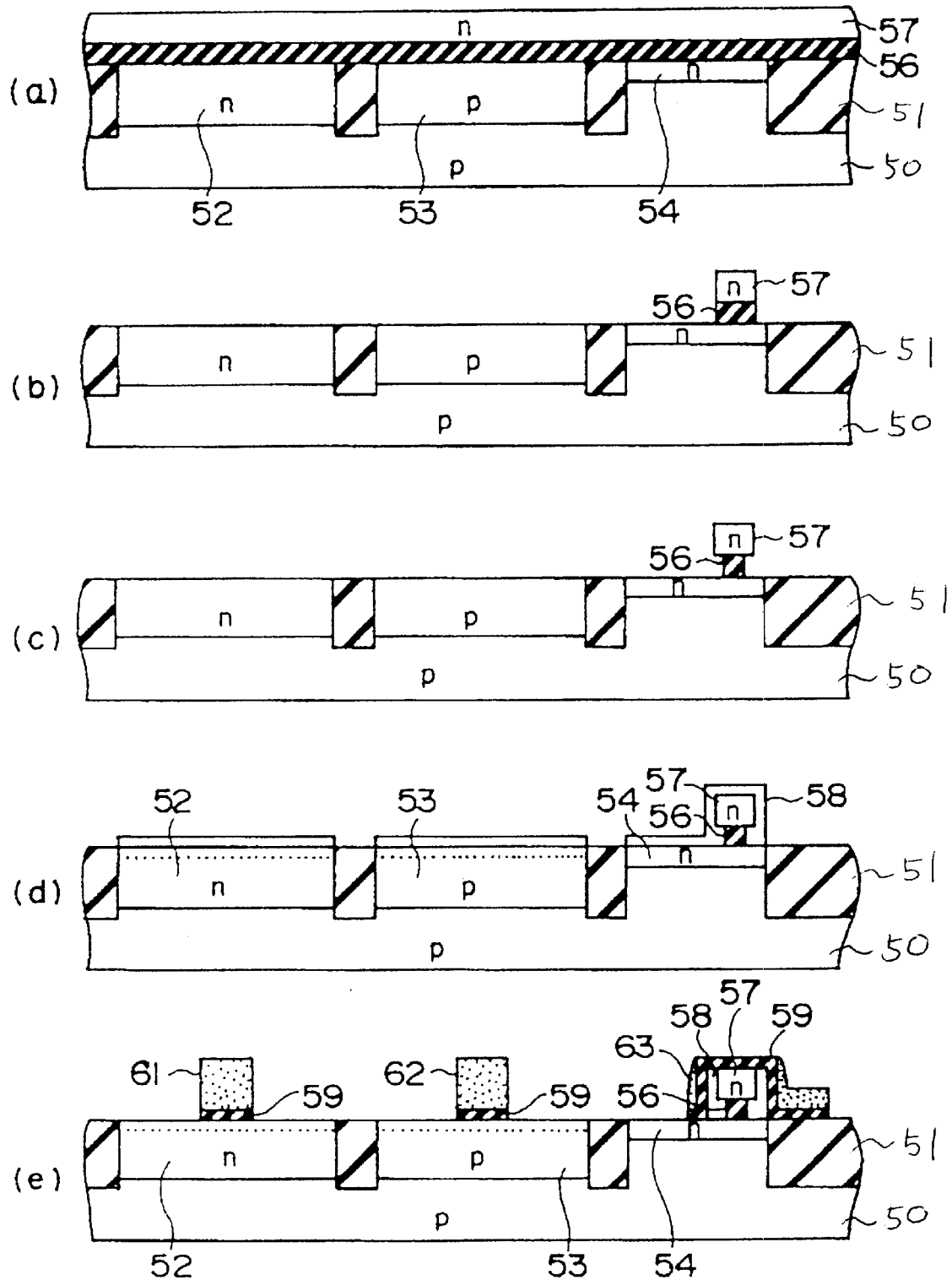
FIGS. 9a to 9e are cross-sectional views of the process of manufacturing a semiconductor integrated circuit according to a sixth embodiment of the present invention.

First, as shown in FIG. 9a, in a manner similar to that described previously in connection with the fifth embodiment, the isolation regions 51 are formed in the p-type silicon substrate 50, and the n-well region 52, the p-well region 53 and the n-well region (n-type diffusion layer region) 54 are formed through ion implantation and heating.

Then, as shown in FIG. 9a, the silicon oxide film 56 having a thickness of 50 nanometers is formed over the entire surface of the substrate 50, for example, by an LPCVD process. Subsequently, after the silicon layer 57 having a thickness of 100 nanometers is formed over the silicon oxide film 56, for example, by an LPCVD process, arsenic (As) ions are implanted into this silicon layer 57 at 20 keV and at $5.0 \times 10^{15}$ cm$^{-2}$. Then, the obtained structure is subjected to heating for impurity activation.

In the above-described process, instead of implanting arsenic (As) ions after the formation of the silicon layer 57, a silicon layer which contains approximately $3.0 \times 10^{20}$ cm$^{-3}$ of P may be formed over the silicon oxide film 56, for example, by an LPCVD process. Otherwise, although either of the above-described methods may be used, the silicon layer 57 may be recrystallized.

Then, as shown in FIG. 9b, the columnar structure portion required to form a field-effect transistor having a vertical columnar structure is formed etching the silicon layer 57 and the silicon oxide film 56, for example, by an RIE process.

Then, as shown in FIG. 9c, the silicon oxide film 56 is partly removed, for example, by an ammonium fluoride treatment. Thus, the silicon oxide film 56 is recessed or set back inward of the columnar structure portion. This set-back structure is favorable to the subsequent epitaxial growth.

Then, as shown in FIG. 9d, the silicon layer 58 having a thickness of 5 nanometers is formed over all the surfaces of the columnar structure portion, as by epitaxial growth. Subsequently, B ions (for example, at 30 keV and at $1.0 \times 10^{13}$ cm$^{-2}$) are implanted into the p-well region 53 for the purpose of obtaining a desired threshold voltage, thereby adjusting the concentration at its channel surface, while P ions (for example, at 150 keV and at $1.5 \times 10^{13}$ cm$^{-2}$) are implanted into the n-well region 52 for the purpose of obtaining a desired threshold voltage, thereby adjusting the concentration at its channel surface.

In this process, instead of forming the silicon layer 58 by epitaxial growth, a silicon layer having a thickness of 5 nanometers may be formed over all the surfaces of the columnar structure portion, as by an LPCVD process. In this case, since the silicon layer is not formed as a single-crystal layer, the silicon layer may be recrystallized if necessary. If a process such as an LPCVD process is used, the removing of part of the silicon oxide film 56 as shown in FIG. 14c may also be omitted.

Then, as shown in FIG. 9e, the silicon oxide film 59 having a thickness of 3 nanometers is formed as a gate insulating film by oxidizing the surfaces of the silicon substrate 50 and the silicon layer 58, for example, in a 10% HCl atmosphere at 800° C. Then, after a polycrystalline silicon film having a thickness of 200 nanometers is deposited, for example, by an LPCVD process, the gate electrodes 61, 62 and 63 are formed by applying a treatment such as an RIE process to the polycrystalline silicon film. If a predetermined form of resist pattern is formed by, for example, photolithography prior to the RIE, the polycrystalline silicon film can easily be left even in a region other than the side wall of the columnar structure portion.

Figure 10:
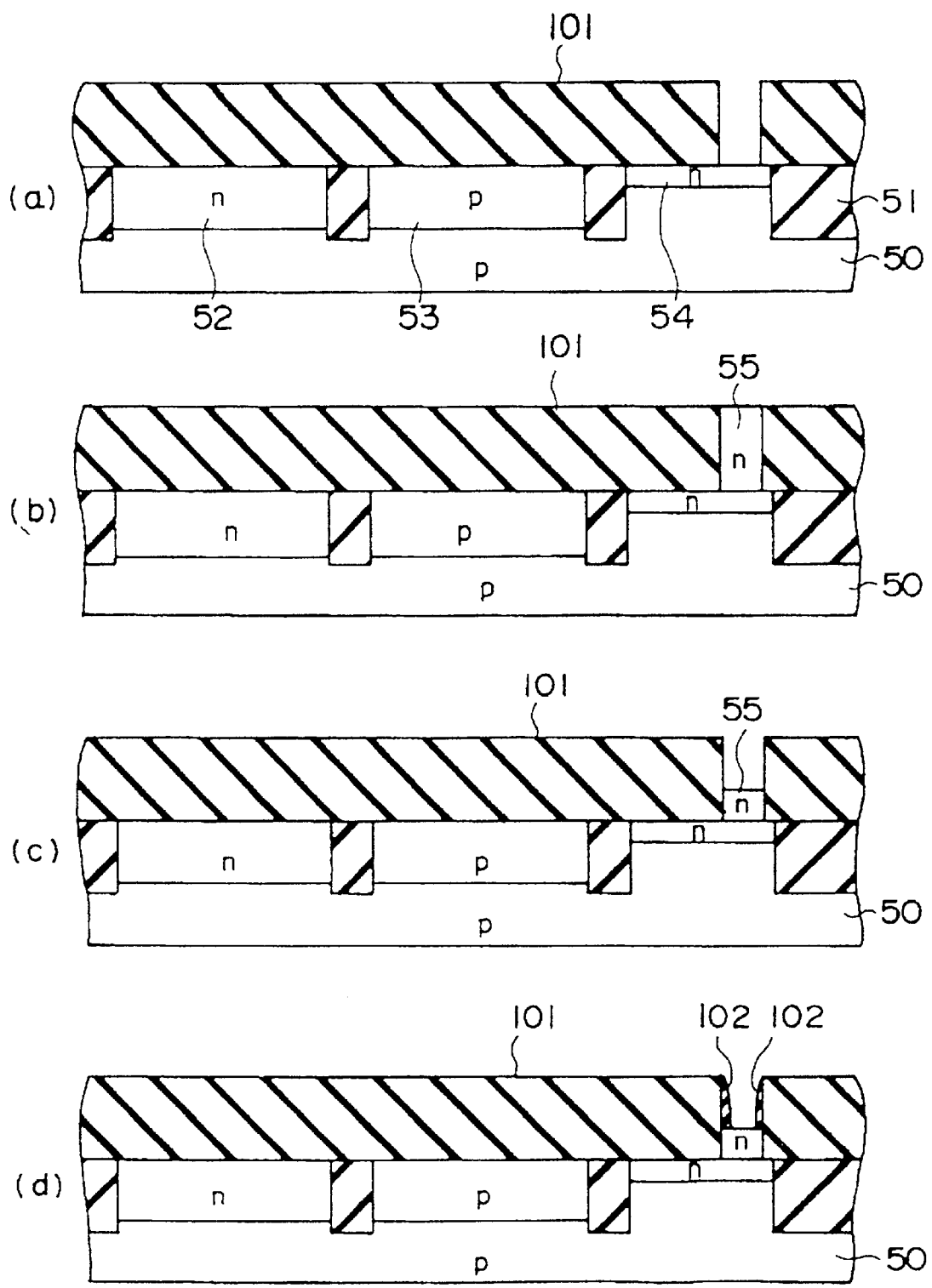
FIGS. 10a to 10h are cross-sectional views of the process of manufacturing a semiconductor integrated circuit according to a seventh embodiment of the present invention.
Figure 10:
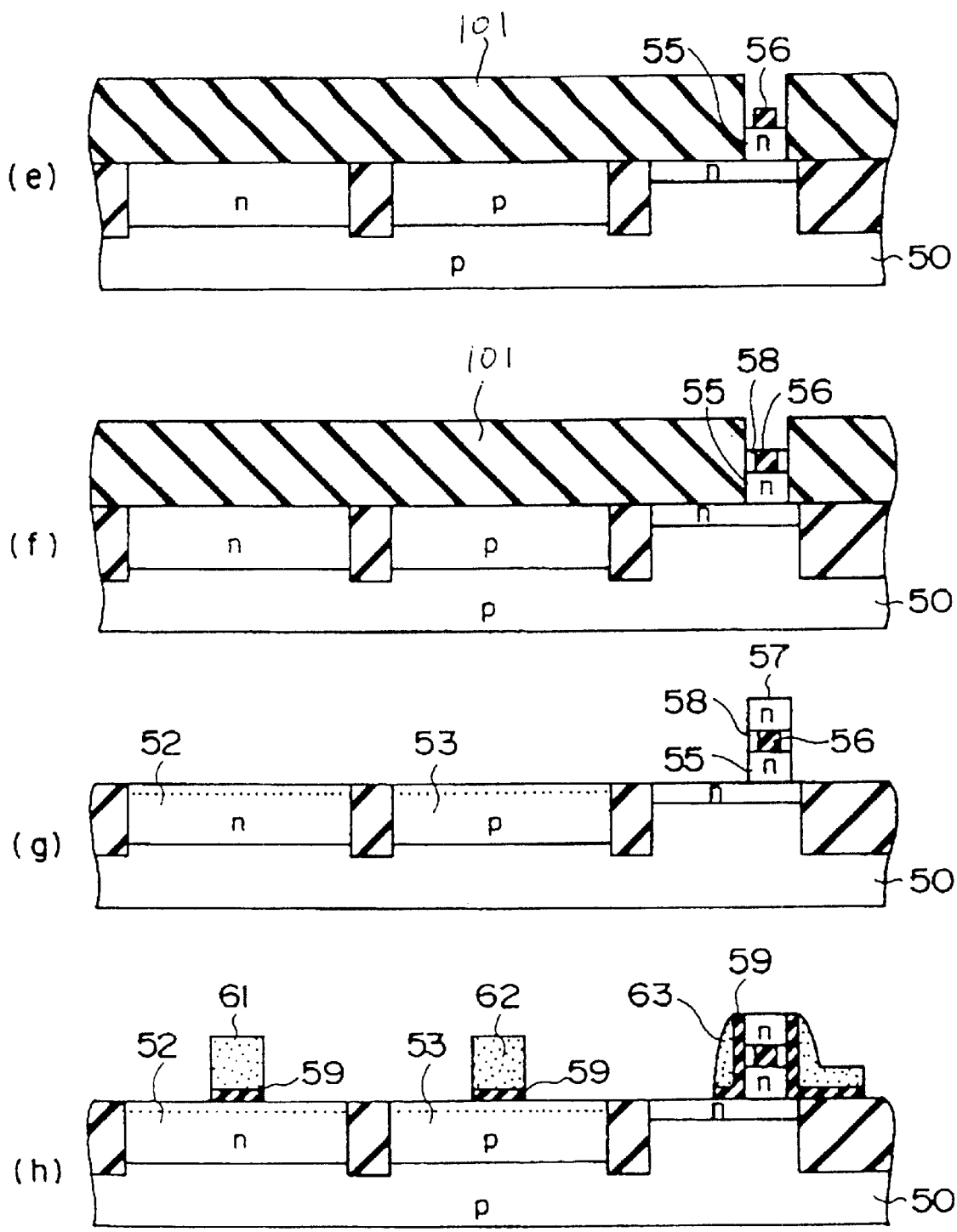

The subsequent processes are identical to those shown in FIGS. 8f to 8l of the fifth embodiment. Specifically, arsenic (As) ions are implanted into a region in which to form an n-type field-effect transistor, and the source and drain regions 65 are formed through heating. Boron (B) ions are implanted into a region in which to form a p-type field-effect transistor, and the source and drain regions 64 are formed through heating. Subsequently, the deposition of the silicon oxide film 71 as an interlayer insulating film, the formation of the contact holes 72 and the formation of the interconnecting layer 73 are carried out, and after the TEOS film 74 is deposited over all of them, the silicon layer 76 is formed. After that, an n-type field-effect transistor of horizontal structure is formed over the silicon layer 76. Then, after the TEOS film 81 is formed and flattened, the via hole 82 is opened and the interconnecting layer 83 is formed, whereby the above-described structure shown in FIG. 10 is obtained.

In the sixth embodiment as well, not only are field-effect transistors having a horizontal structure formed in the first element formation layer and the second element formation layer, but also a field-effect transistor having a vertical columnar structure is formed in a region which couples the first and second element formation layers to each other. Accordingly, the scale of integration can be increased to a great extent compared to conventional semiconductor integrated circuits. Therefore, effects similar to those of the fifth embodiment can be obtained.

FIGS. 10a to 10h are cross-sectional views showing the process of manufacturing a semiconductor integrated circuit according to a seventh embodiment of the present invention. In FIGS. 10a to 10h, identical reference numerals are used to denote portions identical to the corresponding portions shown in FIGS. 8a to 8l, and the detailed description of the same portions is omitted.

First, as shown in FIG. 8a, in a manner similar to that described previously in connection with the fifth embodiment, the isolation regions 51 are formed in the p-type silicon substrate 50, and the n-well region 52, the p-well region 53 and the n-well region (n-type diffusion layer region) 54 are formed, for example, through ion implantation and heating.

Then, as shown in FIG. 10a, after a silicon oxide film 101 having a thickness of 200 nanometers is formed over the entire surface of the substrate 50, for example, by an LPCVD process, the silicon oxide film 101 is partly removed, for example, by an RIE process, thereby forming an opening in a region in which to form a field-effect transistor having a vertical columnar structure.

Subsequently, as shown in FIG. 10b, after the silicon layer 55 having a thickness of 300 nanometers is formed over the entire surface of the substrate 50, for example, by an LPCVD process, arsenic (As) ions (for example, at 20 keV and at $5.0\times10^{15}$ cm$^{-2}$) are implanted into the silicon layer 55. Then, the surface of the silicon layer 55 is flattened by, for example, a CMP process.

In this process, instead of implanting arsenic (As) ions after the formation of the silicon layer 55, a silicon layer of thickness 300 nanometers which contains approximately $3.0\times10^{20}$ cm$^{-3}$ of P may be formed, for example, by an LPCVD process.

Then, as shown in FIG. 10c, the silicon layer 55 is etched to its midway portion, for example, by RIE, so that part of the silicon layer 55 is left at the bottom of the opening formed in the silicon oxide film 101.

Then, as shown in FIG. 10d, a silicon nitride film having a thickness of 10 nanometers is formed, for example, by an LPCVD process, and the silicon nitride film is etched back, for example, by an RIE process, to form a side wall insulating film 102.

Then, as shown in FIG. 10e, the silicon oxide film 56 having a thickness of 50 nanometers is formed by oxidizing the surface of the silicon layer 55, for example, in a 10% HCl atmosphere at 900° C. After that, the side wall insulating film 102 is removed, for example, by thermal phosphoric acid treatment.

Then, as shown in FIG. 10f, the silicon layer 58 is grown to a portion above the exposed portion of the silicon layer 55, for example, by epitaxial growth.

Then, as shown in FIG. 10g, the silicon layer 57 of thickness 100 nanometers is formed over the silicon oxide film 56 and the silicon layer 58, as by an LPCVD process, and arsenic (As) ions (for example, at 20 keV and at $5.0\times10^{15}$ cm$^{-2}$) are implanted into the silicon layer 57. Then, the surface of the silicon layer 57 is flattened, for example, by a CMP process. After that, the silicon oxide film 101 is removed, for example, by an ammonium fluoride treatment.

Then, B ions (for example, at 30 keV and at $1.0\times10^{13}$ cm$^{-2}$) are implanted into the p-well region 53 for obtaining a desired threshold voltage, thereby adjusting the concentration at its channel surface, while P ions (at 160 keV and at $1.5\times10^{13}$ cm$^{-2}$) are implanted into the n-well region 52 for obtaining a desired threshold voltage, thereby adjusting the concentration at its channel surface.

In this process, instead of implanting arsenic (As) ions after the formation of the silicon layer 57, a silicon layer having a thickness of 100 nanometers which contains approximately $3.0\times10^{20}$ cm$^{-3}$ of P may be formed over the silicon oxide film 56, for example, by an LPCVD process. In this case, since the silicon layer 57 is not formed as a single-crystal layer, the silicon layer 57 may be recrystallized if necessary.

Then, as shown in FIG. 10h, the silicon oxide film 59 having a thickness of 3 nanometers is formed as a gate insulating film by oxidizing the surfaces of the silicon substrate 50 and the silicon layers 55, 57 and 58, for example, in a 10% HCl atmosphere at 800° C. Then, after a polycrystalline silicon film having a thickness of 200 nanometers is deposited, for example, by an LPCVD process, the gate electrodes 61, 62 and 63 are formed, for example, by applying a treatment such as an RIE process to the polycrystalline silicon film. If a predetermined form of resist pattern is formed by, for example, photolithography prior to the RIE, the polycrystalline silicon film can easily be left even in a region other than the side wall of the columnar structure portion made of the silicon layers 55, 57 and 58 and the silicon oxide film 56.

The subsequent processes are identical to those shown in FIGS. 8f to 8l of the fifth embodiment. The semiconductor integrated circuit fabricated in the above-described manner can also achieve effects similar to those of the fifth embodiment.

FIGS. 11a to 11f are cross-sectional views showing the process of manufacturing a semiconductor integrated circuit according to an eighth embodiment of the present invention. In FIGS. 11a to 11f, identical reference numerals are used to denote portions identical to the corresponding portions shown in FIGS. 8a to 8l, and the detailed description of the same portions is omitted.

The eighth embodiment differs from the above-described seventh embodiment in that the silicon layer 55 is omitted and only the n-type diffusion layer region 54 of the substrate 50 is used as a source region.

First, as shown in FIG. 8a, in a manner similar to that described previously in connection with the fifth embodiment, the isolation regions 51 are formed in the p-type silicon substrate 50, and the n-well region 52, the p-well region 53 and the n-well region (n-type diffusion layer region) 54 are formed through ion implantation and heating.

Figure 11:
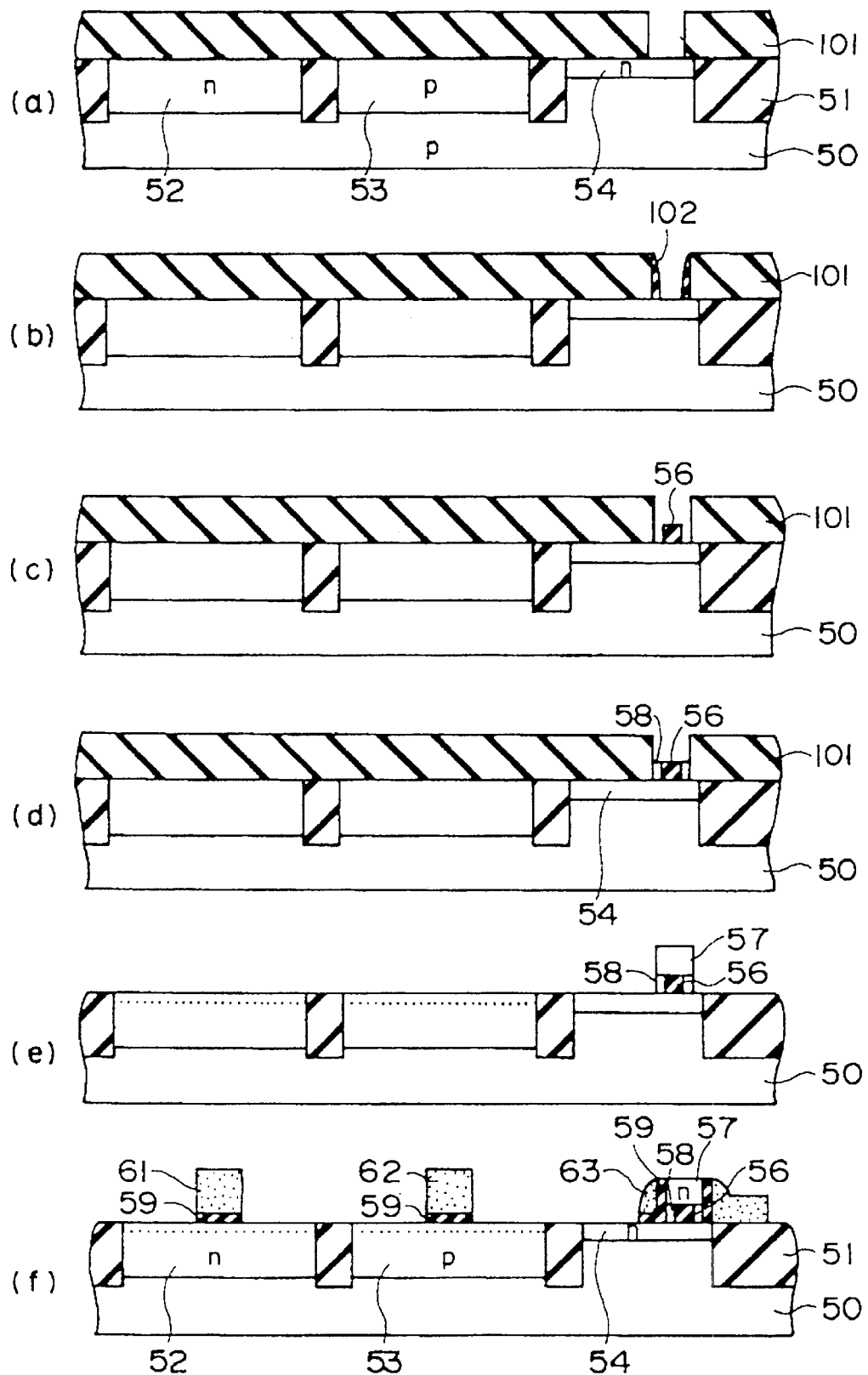
FIGS. 11a to 11f are cross-sectional views of the process of manufacturing a semiconductor integrated circuit according to an eighth embodiment of the present invention.
Figure 12:
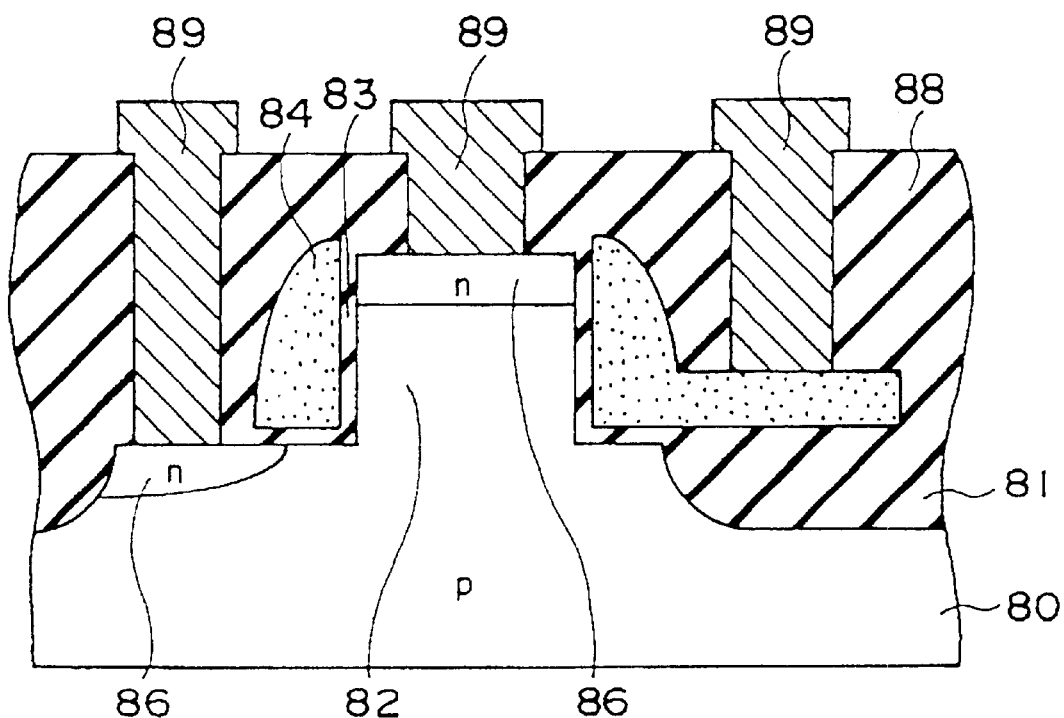
FIG. 12 is a cross-sectional view of an element including a prior art field-effect transistor having a vertical columnar structure.
Figure 13:
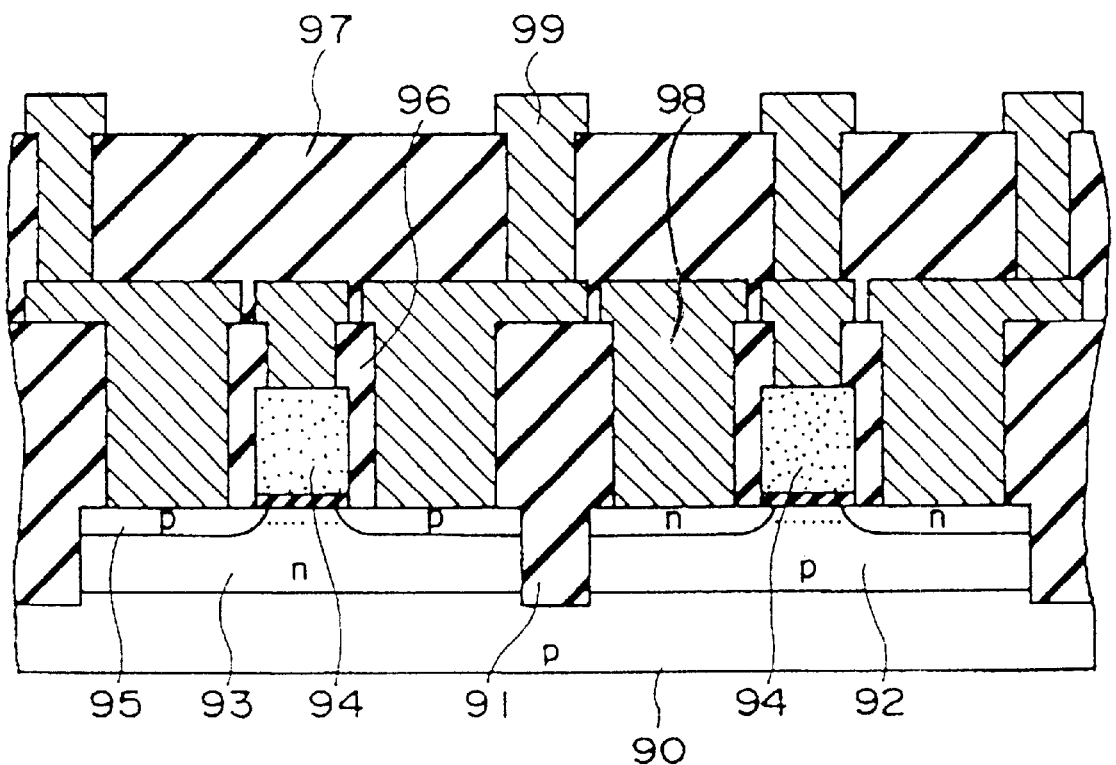
FIG. 13 is a cross-sectional view of a conventional semiconductor integrated circuit.

Then, as shown in FIG. 11a, after the silicon oxide film 101 having a thickness of 200 nanometers is formed over the surface of the substrate 50, for example, by an LPCVD process, the silicon oxide film 101 is partly removed, for example, by an RIE process, thereby forming an opening in a region in which to form a field-effect transistor having a vertical columnar structure.

Subsequently, as shown in FIG. 11b, a silicon nitride film having a thickness of 10 nanometers is formed, for example, by an LPCVD process, and the silicon nitride film is etched back by a method such as an RIE process, to form the side wall insulating film 102.

Then, as shown in FIG. 11c, the silicon oxide film 56 having a thickness of 50 nanometers is formed by oxidizing the surface of the silicon layer 50, for example, in a 10% HCl atmosphere at 900° C. After that, the side wall insulating film 102 is removed, for example, by thermal phosphoric acid treatment.

Then, as shown in FIG. 11d, the silicon layer 58 is grown to a portion above the exposed portion of the silicon layer 50, for example, by epitaxial growth.

Then, as shown in FIG. 11e, the silicon layer 57 having a thickness of 100 nanometers is formed over the silicon oxide film 56 and the silicon layer 58, for example, by an LPCVD process, and arsenic (As) ions (for example, at 20 keV and at $5.0\times10^{15}$ cm$^{-2}$) are implanted into the silicon layer 57 and the silicon layer 57 is heated. Then, the surface of the silicon layer 57 is flattened, for example, by a CMP process. After that, the silicon oxide film 101 is removed, for example, by an ammonium fluoride treatment.

Then, B ions (for example, at 30 keV and at $1.0\times10^{13}$ cm$^{-2}$) are implanted into the p-well region 53 for obtaining a desired threshold voltage, thereby adjusting the concentration at its channel surface, while P ions (for example, at 150 keV and at $1.5\times10^{13}$ cm$^{-2}$) are implanted into the n-well region 52 for obtaining a desired threshold voltage, thereby adjusting the concentration at its channel surface.

In this process, instead of implanting arsenic (As) ions after the formation of the silicon layer 57, a silicon layer having a thickness of 100 nanometers which contains approximately $3.0\times10^{20}$ cm$^{-3}$ of P may be formed over the silicon oxide film 56, for example, by an LPCVD process. In this case, since the silicon layer 57 is not formed as a single-crystal layer, the silicon layer 57 may be recrystallized if necessary.

Then, as shown in FIG. 11f, the silicon oxide film 59 having a thickness of 2 nanometers is formed as a gate insulating film by oxidizing the surfaces of the silicon substrate 50 and the silicon layers 57 and 58, for example, in a 10% HCl atmosphere at 800° C. Then, after a polycrystalline silicon film of thickness 200 nanometers is deposited, for example, by an LPCVD process, the gate electrodes 61, 62 and 63 are formed by applying a treatment such as an RIE process to the polycrystalline silicon film. If a predetermined form of resist pattern is formed by, for example, photolithography prior to the RIE, the polycrystalline silicon film can easily be left even in a region other than the side wall of the columnar structure portion made of the silicon layers 57 and 58 and the silicon oxide film 56.

The subsequent processes are identical to those shown in FIGS. 8f to 8l of the fifth embodiment. The semiconductor integrated circuit fabricated in the above-described manner can also achieve effects similar to those of the fifth embodiment.

The present invention is not limited to any of the above-described embodiments, and can be variously modified in practice without departing from the gist of the present invention.

As described above in detail, since the field-effect transistor having a vertical columnar structure according to the present invention has a layer made of an insulation material between its source region and its drain region, punch-through of an element can be restrained without the need to increase the impurity concentration in a semiconductor layer which forms a channel region. Moreover, since neither of the source and drain regions has a region made of an insulation material similar to those of the conventional structure, no increase in the parasitic resistance of the element is incurred. Accordingly, a further scaling of the element is enabled and a high-performance semiconductor device which operates at high speeds is realized.

In addition, if a semiconductor integrated circuit is constructed by using the field-effect transistor having a vertical columnar structure according to the present invention, not only are transistors formed in a plurality of planes, but a transistor can also be formed in a region which couples these planes to each other, whereby the scale of integration per element can be increased to a great extent compared to conventional semiconductor integrated circuits. In addition, the total length of interconnecting lines can be reduced to restrain a decrease in operating speed due to interconnecting delay, whereby a high-performance semiconductor integrated circuit which operates at high speeds can be realized.

What is claimed is:

1. A semiconductor device comprising:
   a columnar structure portion which includes a first semiconductor layer, a buried insulation film and a second semiconductor layer all of which are stacked over a semiconductor substrate, said buried insulation film having contact surfaces, said buried insulation film being disposed between the first and second semiconductor layers, the contact surfaces being covered completely with said first and second semiconductor layers;
   a third semiconductor layer disposed between the first and second semiconductor layers, and disposed on said buried insulation film in a region between said first and second semiconductor layers and disposed at a side surface of said columnar structure portion; and
   a gate electrode formed over a surface of said third semiconductor layer with a gate insulation film interposed therebetween.

2. A semiconductor device according to claim 1, wherein said gate electrode is formed to surround the side surface of said semiconductor layer.

3. A semiconductor device comprising:
   a columnar structure portion including a buried insulation film and a first semiconductor layer which are stacked over a semiconductor substrate, said buried insulation film having contact surfaces, said buried insulation film being disposed between the semiconductor substrate and the first semiconductor layer, the contact surfaces being covered completely with said semiconductor substrate and said first semiconductor layer;

a second semiconductor layer disposed between the semiconductor substrate and the first semiconductor layer, and disposed on said buried insulation film in a region between said semiconductor substrate and first semiconductor layer; and a gate electrode formed over a surface of said second semiconductor layer with a gate insulation film being interposed therebetween.

4. A semiconductor device according to claim 3, wherein said gate electrode is formed to surround the side surface of said semiconductor layer.

5. A semiconductor device comprising:

a first element formation layer including a plurality of field-effect transistors of horizontal structure formed over a semiconductor substrate;

a second element formation layer including a plurality of field-effect transistors of horizontal structure, the second element formation layer formed on a plane different from said first element formation layer; and a field-effect transistor of vertical columnar structure provided between said first element formation layer and said second element formation layer and connected to at least one transistor of said first element formation layer and to at least one transistor of said second element formation layer, said field-effect transistor of vertical columnar structure including a semiconductor layer formed on said semiconductor substrate in a columnar state, a gate electrode formed over a side surface of said semiconductor layer, and a buried insulation film for making an effective depth of a channel shallow, said buried insulation film being formed inside a region in which said channel is formed.

6. A semiconductor device according to claim 5, wherein said gate electrode is formed to surround the side surface of said semiconductor layer.

7. A semiconductor device comprising:

a columnar structure portion including a first semiconductor layer, a buried insulation film and a second semiconductor layer in a stacked arrangement, the buried insulation film being disposed between the first and second semiconductor layers and having dimensions in a plane perpendicular to the direction of the stacking smaller than the dimensions of the first and second semiconductor layers to form a recess between the first and the second semiconductor layers and the edge of the buried insulation film a third semiconductor layer disposed in at least the recess at a side surface of said columnar structure portion;

a gate insulation film disposed on the third semiconductor layer; and a gate electrode disposed over a surface of said gate insulation film.

8. A semiconductor device according to claim 7, wherein said gate electrode is formed to surround the side surface of said semiconductor layer.

9. A semiconductor device comprising:

a columnar structure portion which includes:
a first semiconductor layer;
an insulating layer formed on the first semiconductor layer;
a second semiconductor layer formed on the insulating layer;
a third semiconductor layer surrounding a side surface of the first and second semiconductor layers and the insulating layer; and
a gate electrode formed over a side surface of the third semiconductor layer with a gate insulating layer interposed therebetween.

10. A semiconductor device comprising:

a field-effect transistor having a vertical columnar structure, said field-effect transistor includes a semiconductor substrate, a semiconductor layer formed over part of said semiconductor substrate and a gate electrode formed over a side surface of said semiconductor layer with a gate insulation film interposed therebetween, said gate electrode introducing a channel in said semiconductor layer; and an insulation film formed in at least part of a region in said field effect transistor wherein said semiconductor layer of said field effect transistor comprises a first semiconductor layer and a second semiconductor layer, said first semiconductor layer disposed over part of the semiconductor substrate, said insulation film disposed on a portion of said first semiconductor layer, and said second semiconductor layer disposed on the insulation film and being dimensioned larger than the insulation film to form a set back region between the first and second semiconductor layers and adjacent a portion of a side surface of the insulation film, and said gate insulation film disposed on a portion of a side surface of the first and second semiconductor layers and the set back region.

11. A semiconductor device according to claim 10, wherein said gate electrode is formed to surround the side surface of said first and second semiconductor layer.

* * * * *